US012609283B2

(12) United States Patent
Kamp et al.

(10) Patent No.: US 12,609,283 B2
(45) Date of Patent: Apr. 21, 2026

(54) CONTROL OF PULSING FREQUENCIES AND DUTY CYCLES OF PARAMETERS OF RF SIGNALS

(71) Applicant: Lam Research Corporation, Fremont, CA (US)

(72) Inventors: Tom A. Kamp, San Jose, CA (US); Yuhou Wang, Fremont, CA (US); Michael John Martin, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 587 days.

(21) Appl. No.: 18/009,308

(22) PCT Filed: Jun. 8, 2021

(86) PCT No.: PCT/US2021/036477
§ 371 (c)(1),
(2) Date: Dec. 8, 2022

(87) PCT Pub. No.: WO2021/257331
PCT Pub. Date: Dec. 23, 2021

(65) Prior Publication Data
US 2023/0223236 A1 Jul. 13, 2023

Related U.S. Application Data

(60) Provisional application No. 63/039,335, filed on Jun. 15, 2020.

(51) Int. Cl.
*H01J 37/32* (2006.01)

(52) U.S. Cl.
CPC .. *H01J 37/32165* (2013.01); *H01J 37/32146* (2013.01); *H01J 37/32174* (2013.01)

(58) Field of Classification Search
None
See application file for complete search history.

(56) References Cited

U.S. PATENT DOCUMENTS

| 9,502,217 B2 | 11/2016 | Kanazawa et al. | |
| 9,515,633 B1 | 12/2016 | Long et al. | |
| 9,583,357 B1 * | 2/2017 | Long ................. | H01J 37/32128 |
| 9,761,459 B2 * | 9/2017 | Long ................. | H01J 37/32422 |

(Continued)

OTHER PUBLICATIONS

ISR & WO PCT/US2021/036477, dated Sep. 28, 2021, 8 pages.

*Primary Examiner* — Srinivas Sathiraju
(74) *Attorney, Agent, or Firm* — Polygon IP, LLP

(57) ABSTRACT

A method for pulsing is described. The method includes generating a first radio frequency (RF) signal, and pulsing a parameter of the first RF signal between a first parameter level and a second parameter level at a pulsing frequency during a cycle of a digital pulsed signal. The method further includes generating a second RF signal, and pulsing a parameter of the second RF signal at a higher pulsing frequency than the pulsing frequency of the parameter of the first RF signal during the cycle. During the cycle, a start time of pulsing the parameter of the first RF signal is synchronized with a start time of pulsing the parameter of the second RF signal and an end time of pulsing the parameter of the first RF signal is synchronized with an end time of pulsing the parameter of the second RF signal.

15 Claims, 14 Drawing Sheets

(Plasma Tool w. Three RFGs)

(56)          References Cited

U.S. PATENT DOCUMENTS

| | | | |
|---|---|---|---|
| 12,217,972 B2 * | 2/2025 | Dole | ................... H01L 21/3065 |
| 12,237,203 B2 * | 2/2025 | Kamp | ............... H01J 37/32623 |
| 12,387,909 B2 * | 8/2025 | Marakhtanov | .... H01J 37/32165 |
| 2002/0044316 A1 * | 4/2002 | Myers | ................... H04J 14/002 |
| | | | 398/43 |
| 2003/0072051 A1 * | 4/2003 | Myers | ................... H04J 14/002 |
| | | | 398/43 |
| 2013/0213935 A1 | 8/2013 | Liao et al. | |
| 2014/0148016 A1 | 5/2014 | Kanazawa et al. | |
| 2014/0349033 A1 | 11/2014 | Nonaka et al. | |
| 2017/0040174 A1 * | 2/2017 | Long | ................. H01J 37/32146 |
| 2017/0040176 A1 * | 2/2017 | Long | ................. H01J 37/32146 |
| 2017/0084432 A1 * | 3/2017 | Valcore, Jr. | ....... H01J 37/32146 |
| 2018/0330921 A1 | 11/2018 | Radomski et al. | |
| 2019/0043728 A1 * | 2/2019 | Zhou | ................. H01L 21/30655 |
| 2020/0075290 A1 | 3/2020 | Kawasaki et al. | |
| 2020/0176222 A1 | 6/2020 | Shoeb et al. | |
| 2020/0373193 A1 * | 11/2020 | Kamp | ............... H01L 21/67253 |
| 2022/0254612 A1 * | 8/2022 | Kimball | ............ H01J 37/32642 |
| 2023/0005717 A1 * | 1/2023 | Dole | .................. H01L 21/3065 |
| 2023/0083737 A1 * | 3/2023 | Kamp | ............... H01L 21/68742 |
| | | | 438/14 |
| 2023/0178344 A1 * | 6/2023 | Drewery | ........... H01J 37/32449 |
| | | | 156/345.51 |
| 2023/0223236 A1 * | 7/2023 | Kamp | ............... H01J 37/32174 |
| | | | 156/345.28 |
| 2023/0274913 A1 * | 8/2023 | Wu | ................... H01J 37/32174 |
| | | | 327/291 |
| 2023/0274914 A1 * | 8/2023 | Marakhtanov | .... H01J 37/32174 |
| | | | 361/234 |
| 2023/0282448 A1 * | 9/2023 | Shoeb | ............... H01J 37/32183 |
| | | | 315/111.21 |
| 2025/0140565 A1 * | 5/2025 | Dole | ................. H01J 37/32165 |
| 2025/0191962 A1 * | 6/2025 | Kamp | ............... H01L 21/68721 |

* cited by examiner (Plasma Tool w. Three RFGs)

(Plasma Tool w. Three RFGs)

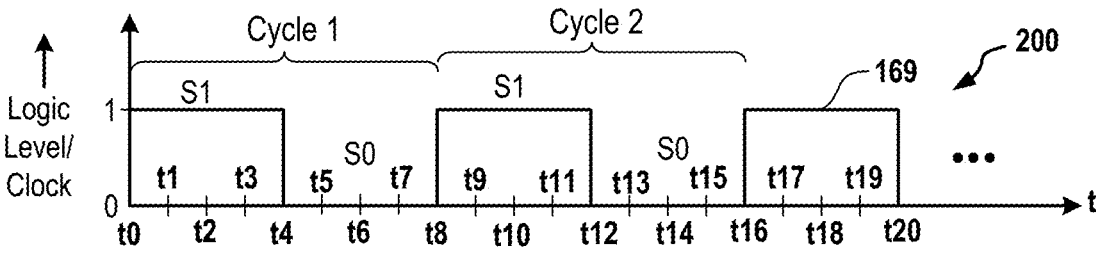
FIG. 2A (For Bias)
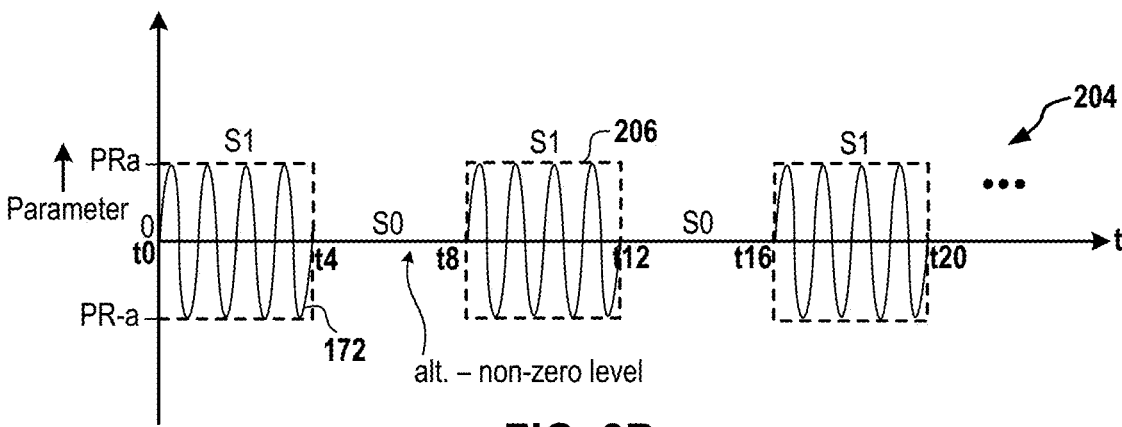
FIG. 2B (Bias)
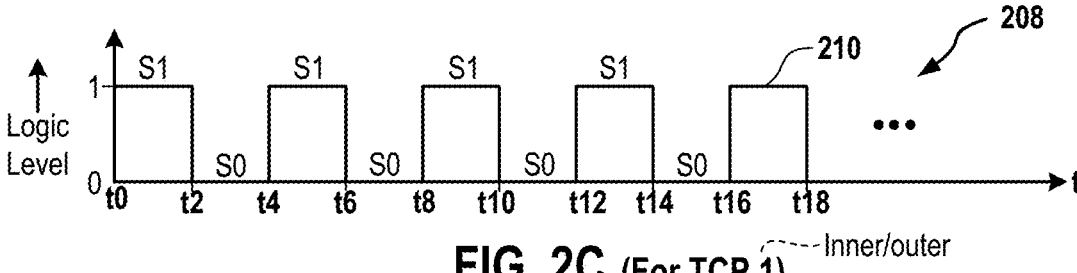
FIG. 2C (For TCP 1)
alt. – non-zero level
PRb
Parameter
S1   S1   S1   S1   S1
0
t0   t2   t4   t6   t8   t10   t12   t14   t16   t18
S0   S0   S0   S0
PR-b
214
212
184
alt. – pulsed at a higher multiple of bias than TCP 2
FIG. 2D (TCP 1)

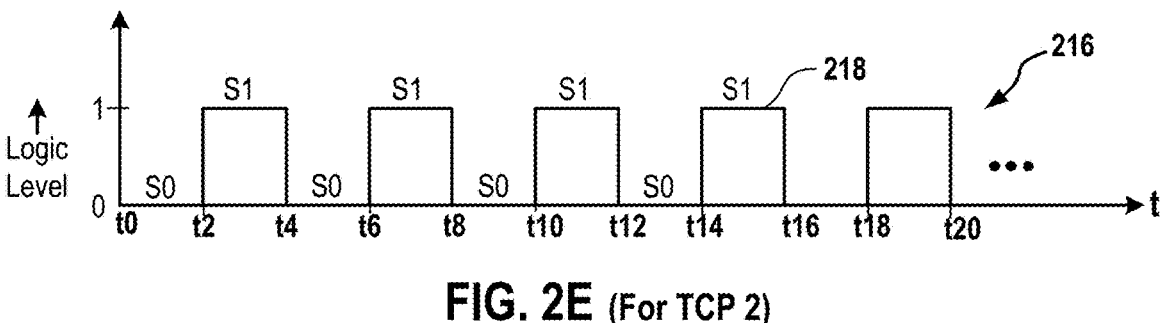
FIG. 2E (For TCP 2)
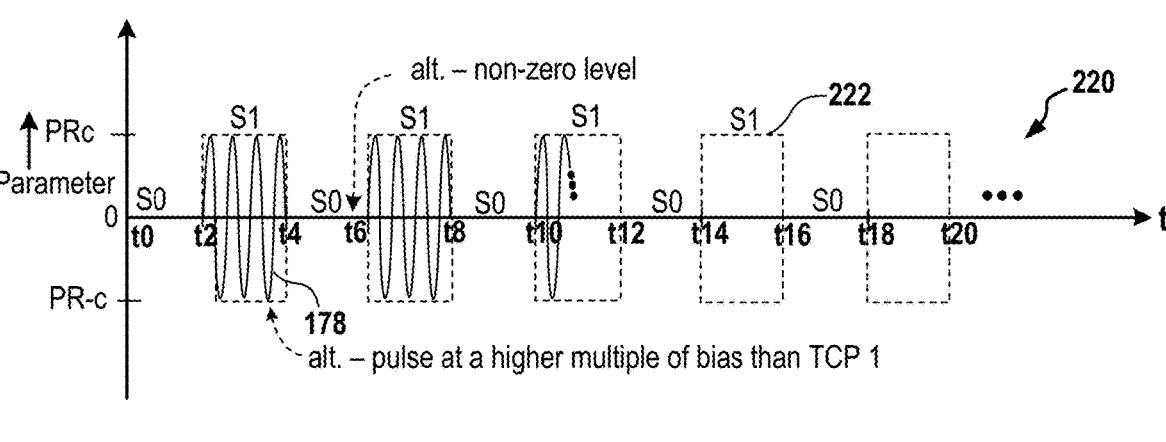
FIG. 2F (TCP 2)

(Tool w. 2 RFGs)

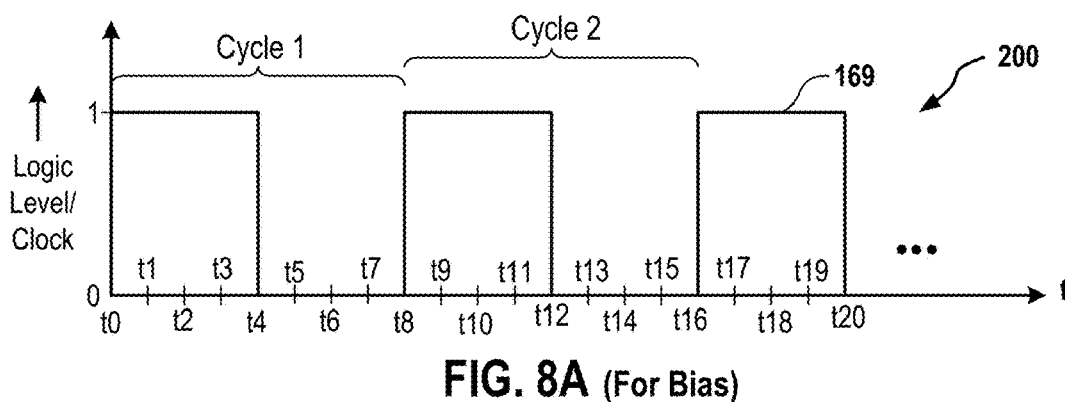
FIG. 8A (For Bias)
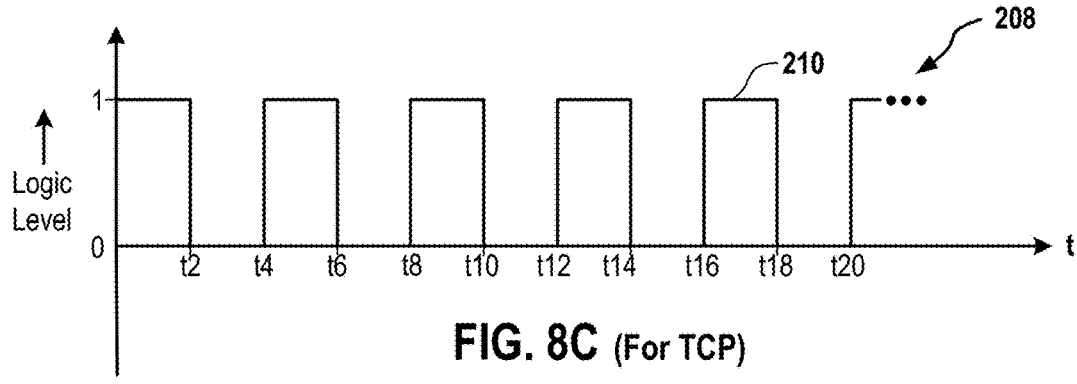
FIG. 8B (For Bias)
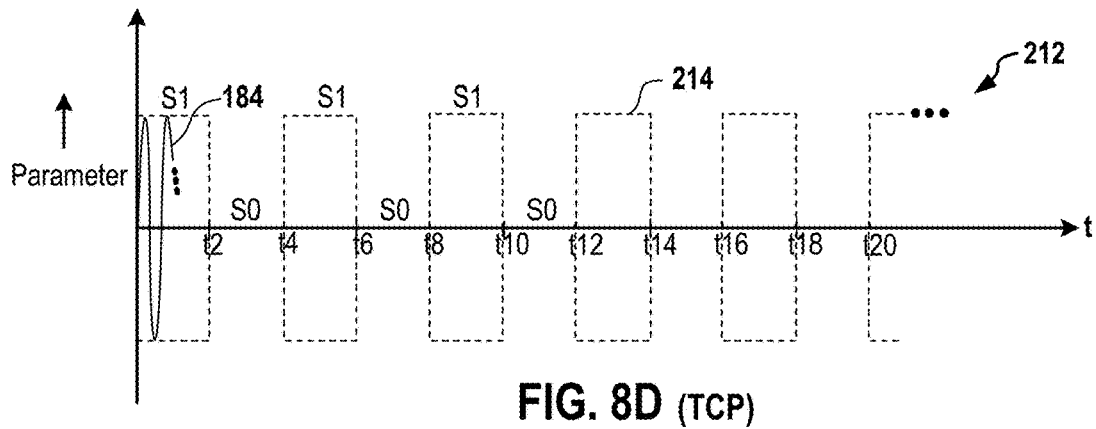
FIG. 8C (For TCP)
FIG. 8D (TCP)

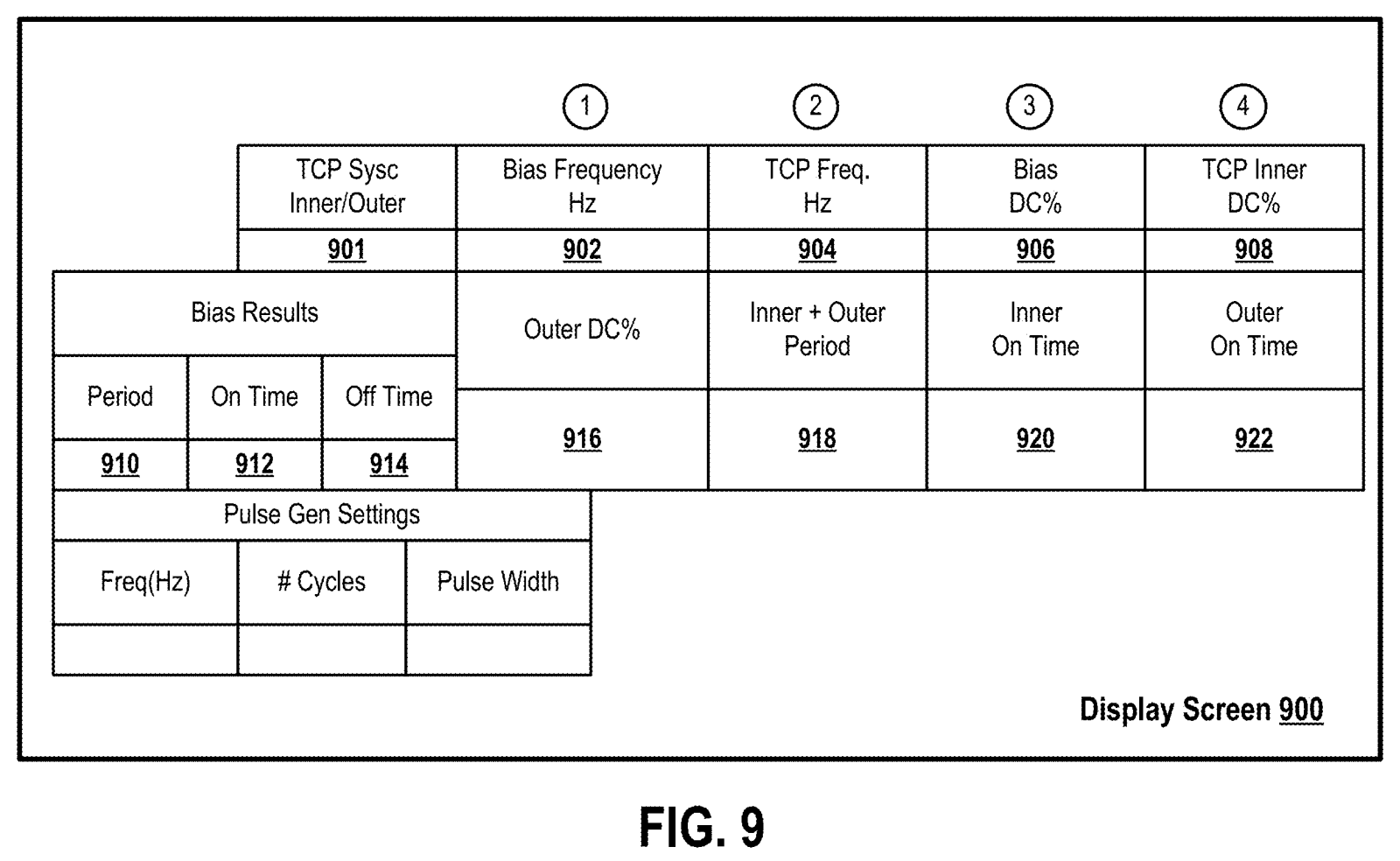

| TCP Sysc Inner/Outer 901 | Bias Frequency Hz 902 ① | TCP Freq. Hz 904 ② | Bias DC% 906 ③ | TCP Inner DC% 908 ④ |
|---|---|---|---|---|
| | Outer DC% | Inner + Outer Period | Inner On Time | Outer On Time |
| | 916 | 918 | 920 | 922 |

Bias Results

| Period | On Time | Off Time |
|---|---|---|
| 910 | 912 | 914 |

Pulse Gen Settings

| Freq(Hz) | # Cycles | Pulse Width |
|---|---|---|
| | | |

Display Screen 900

FIG. 9

(CW RFG)

1

CONTROL OF PULSING FREQUENCIES AND DUTY CYCLES OF PARAMETERS OF RF SIGNALS

CLAIM OF PRIORITY

This application is a national stage filing of and claims priority, under 35 U.S.C. § 371, to PCT/US21/36477, filed on Jun. 8, 2021, and titled "CONTROL OF PULSING FREQUENCIES AND DUTY CYCLES OF PARAMETERS OF RF SIGNALS", which claims the benefit of and priority, under 35 U.S.C. § 119(e), to U.S. Provisional Patent Application No. 63/039,335, filed on Jun. 15, 2020, and titled "CONTROL OF PULSING FREQUENCIES AND DUTY CYCLES OF PARAMETERS OF RF SIGNALS", all of which are incorporated by reference herein in their entirety.

FIELD

The present embodiments relate to systems and methods for control of pulsing frequencies and duty cycles at which radio frequency (RF) signals are pulsed.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, a radio frequency (RF) generator is connected to an impedance matching network. The impedance matching network is connected to a chuck of a plasma chamber. A semiconductor wafer is placed within the plasma chamber. When a process gas is applied to the plasma chamber and an RF signal is supplied from the RF generator via the impedance matching network to the plasma chamber, plasma is generated within the plasma chamber.

The plasma is used to process a semiconductor wafer. However, there is a limit on a type of processes that can be performed on the semiconductor wafer.

It is in this context that embodiments described in the present disclosure arise.

SUMMARY

Embodiments of the disclosure provide systems, apparatus, methods and computer programs for control of pulsing frequencies and duty cycles at which radio frequency (RF) signals are pulsed. It should be appreciated that the present embodiments can be implemented in numerous ways, e.g., a process, an apparatus, a system, a device, or a method on a computer readable medium. Several embodiments are described below.

In one embodiment, simultaneous multi-frequency and multi-duty cycle RF pulsing is described. The RF pulsing is synchronized or asynchronized. This will allow for multiple combinations of pulsing an RF component, such as a transformer coupled plasma (TCP) coil or a bias electrode, within a pulsing cycle of another component, such as the bias electrode of the TCP coil. For example, power an RF signal that is supplied to the TCP coil is pulsed at a frequency of 500 hertz (Hz) and at a 50% duty cycle and power of an RF signal that is supplied to the bias electrode is pulsed at a frequency of 100 Hz and at a 20% duty cycle. The different pulsing frequencies and different duty cycles adds a higher amount of flexibility to achieve different process applications. For example, the different process applications are achieved from applying a lower pulsing frequency of the power of the RF signal to the bias electrode compared to a pulsing frequency of the RF signal supplied to the TCP coil or applying a different duty cycle of the power of the RF signal to the bias electrode than the power of the RF signal supplied to the TCP coil.

In an embodiment, a bias RF generator that supplies the RF signal to the bias electrode and a TCP RF generator that supplies the RF signal to the TCP coil can run independently in its corresponding pulsing frequency and duty cycle and supply the corresponding RF signals upon receiving a sync trigger signal. The bias and TCP RF generators start pulsing at the same time but can run at different pulsing frequencies and different duty cycles and end pulsing at the same time. The duty cycles and the pulsing frequencies can be configured in a process recipe. One complete bias pulse cycle of the RF signal generated by the bias RF generator occurs over one or multiple complete TCP pulse cycles of the RF signal generated by the TCP RF generator. A bias pulse cycle starts at a time one or multiple TCP pulse cycles start and ends at a time the one or multiple TCP pulse cycles end.

In one embodiment, one complete TCP pulse cycle of the RF signal generated by the TCP RF generator occurs over one or multiple complete bias pulse cycles of the RF signal generated by the bias RF generator. A TCP pulse cycle starts at a time one or multiple bias pulse cycles start and ends at a time the one or multiple bias pulse cycles end.

In an embodiment, four RF components, such as two TCP RF generators and two bias RF generators, have pulsing frequencies. A power applied to a first one of the four RF components is pulsed at a first pulsing frequency. Similarly, a power applied to a second one of the four RF components is pulsed at a second pulsing frequency, a power applied to a third one of the four RF components is pulsed at a third pulsing frequency, and a power applied to a fourth one of the four RF components is pulsed at a fourth pulsing frequency. The second pulsing frequency is a first integer multiple of the first pulsing frequency. Similarly, the third pulsing frequency is a second integer multiple of the second pulsing frequency and the fourth pulsing frequency is a third integer multiple of the first pulsing frequency. As an example, the first, second, and third integer multiples are equal. As another example, either the second integer multiple or the third integer multiple or both the second and third integer multiples are different from, such as greater than or less than, the first integer multiple. Bias pulse cycles of powers of the two bias RF generators and TCP pulse cycles of powers of the two TCP RF generators start at a time and end at a time.

In one embodiment, a method for pulsing is described. The method includes generating a first RF signal, and pulsing a parameter of the first RF signal between a first parameter level and a second parameter level at a pulsing frequency during a cycle of a digital pulsed signal. The method further includes generating a second RF signal, and pulsing a parameter of the second RF signal at a higher pulsing frequency than the pulsing frequency of the parameter of the first RF signal during the cycle. During the cycle, a start time of pulsing the parameter of the first RF signal is synchronized with a start time of pulsing the parameter of the second RF signal and an end time of pulsing the parameter of the first RF signal is synchronized with an end time of pulsing the parameter of the second RF signal.

In an embodiment, a controller is described. The controller includes a processor configured to control a first RF generator to generate a first RF signal. The first RF generator is configured to pulse a parameter of the first RF signal between a first parameter level and a second parameter level at a pulsing frequency during a cycle of a digital pulsed signal. The processor is configured to control a second RF generator to generate a second RF signal. The second RF generator is configured to pulse a parameter of the second RF signal at a higher pulsing frequency than the pulsing frequency of the parameter of the first RF signal during the cycle. A start time at which the parameter of the first RF signal is pulsed is synchronized with a start time at which the parameter of the second RF signal is pulsed and an end time at which the parameter of the first RF signal is pulsed is synchronized with an end time of at which the parameter of the second RF signal is pulsed. The controller includes a memory device coupled to the processor for storing the first and second parameter levels of the first RF signal.

In one embodiment, a plasma system for pulsing is described. The plasma system includes a first RF generator configured to generate a first RF signal. The first RF generator is configured to pulse a parameter of the first RF signal between a first parameter level and a second parameter level at a pulsing frequency during a cycle of a digital pulsed signal. The plasma system includes a second RF generator configured to generate a second RF signal. The second RF generator is configured to pulse a parameter of the second RF signal at a higher pulsing frequency than the pulsing frequency of the parameter of the first RF signal during the cycle. During the cycle, a start time of at which the parameter of the first RF signal is pulsed is synchronized with a start time at which the parameter of the second RF signal is pulsed and an end time at which the parameter of the first RF signal is pulsed is synchronized with an end time at which the parameter of the second RF signal is pulsed.

Some advantages of the herein described systems and methods include applying different pulsing frequencies or different duty cycles or a combination thereof of parameters of RF signals to a plasma chamber. For example, a pulsing frequency of a parameter of a bias RF signal that is supplied via a match to a substrate support of the plasma chamber is different than a pulsing frequency of a parameter of a source RF signal that is supplied via a match to an RF coil of the plasma chamber. When the different pulsing frequencies are applied to the plasma chamber, a variety of processes can be performed on a substrate placed on the substrate support compared to when the same pulsing frequency of the parameters of the source and bias RF signals is applied. As another example, a duty cycle of the parameter of the bias RF signal is different than a duty cycle of the parameter of the source RF signal. When the different duty cycles are applied to the plasma chamber, a variety of processes can be performed on the substrate placed on the substrate support compared to when the same duty cycle of the parameters of the source and bias RF signals is applied.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2A is an embodiment of a graph to illustrate a process recipe signal.

FIG. 2B is an embodiment of a graph to illustrate a parameter of an RF signal versus time t.

FIG. 2C is an embodiment of a graph to illustrate a digital pulsed signal that is either generated by a source RF generator or is sent to the source RF generator by a processor.

FIG. 2D is an embodiment of a graph to illustrate a parameter of an RF signal versus the time t.

FIG. 2E embodiment of a graph to illustrate a digital pulsed signal that is either generated by a source RF generator or is sent to the source RF generator by the processor.

FIG. 2F is an embodiment of a graph to illustrate a parameter of an RF signal versus the time t.

FIG. 8A is an embodiment of the graph of FIG. 2A to illustrate the process recipe signal of FIG. 2A.

FIG. 8B is an embodiment of the graph of FIG. 2B to illustrate the parameter of the RF signal generated by the bias RF generator.

FIG. 8C is an embodiment of the graph of FIG. 2C to illustrate the digital pulsed signal of FIG. 2C.

FIG. 8D is an embodiment of the graph of FIG. 2D to illustrate the parameter of the RF signal of FIG. 2D.

FIG. 9 is an embodiment of a display screen of a host computer.

DETAILED DESCRIPTION

The following embodiments describe systems and methods for control of pulsing frequencies and duty cycles of pulsing radio frequency (RF) signals. It will be apparent that the present embodiments may be practiced without some or all of these specific details. In other instances, well known process operations have not been described in detail in order not to unnecessarily obscure the present embodiments.

Figure 1A:
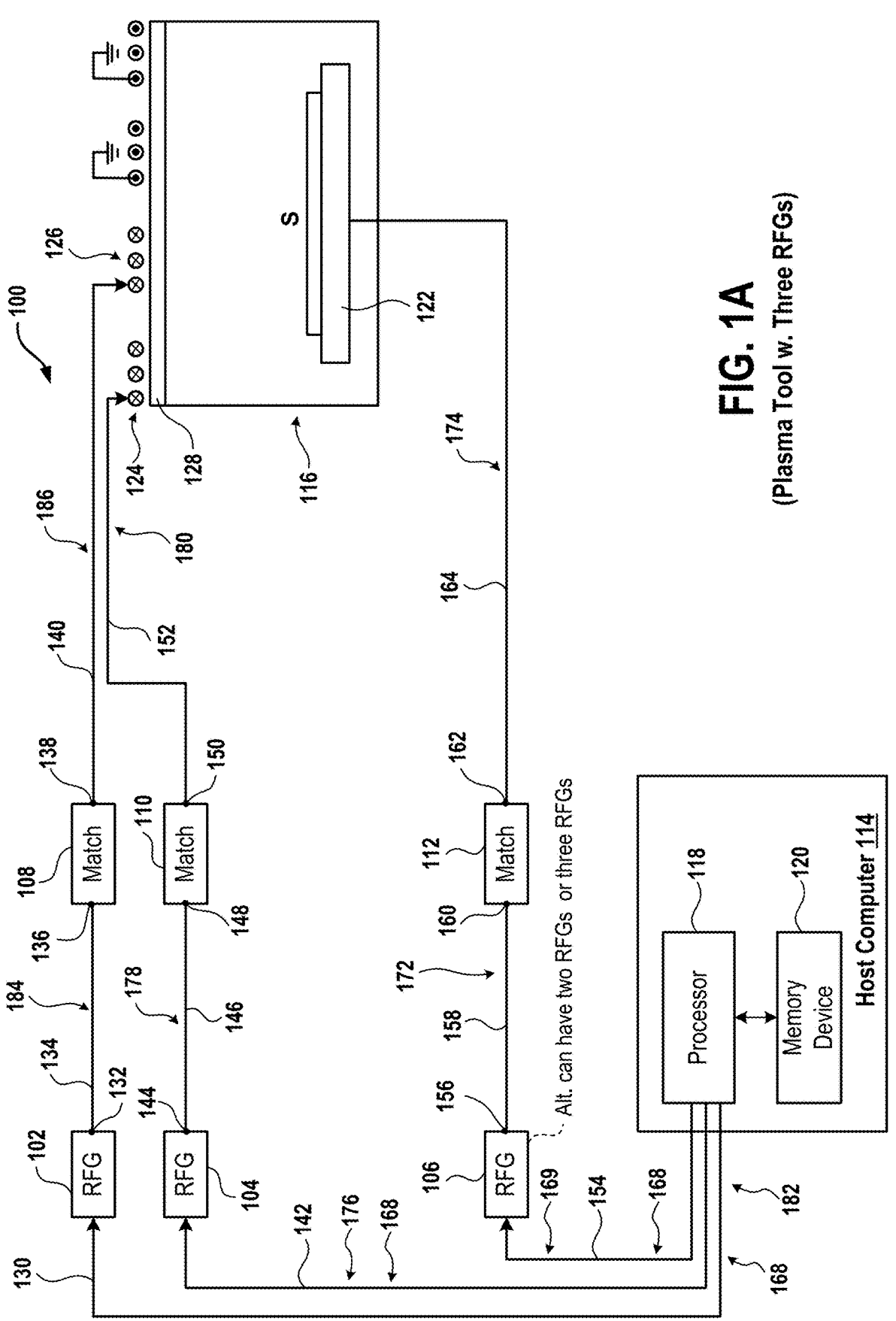
FIG. 1A is a diagram of an embodiment of a plasma system to illustrate a control of duty cycles of RF signals that are generated by source radio frequency (RF) generators coupled to transformer coupled plasma (TCP) coils and an RF signal that is generated by a bias RF generator coupled to a substrate support.

FIG. 1A is a diagram of an embodiment of a plasma system 100 to illustrate a control of duty cycles and pulsing frequencies. The duty cycles and pulsing frequencies are of parameters of RF signals that are generated by source RF generators coupled to multiple transformer coupled plasma (TCP) coils and of an RF signal that is generated by a bias RF generator coupled to a substrate support. The plasma system 100 includes a source RF generator 102, another source RF generator 104, a bias RF generator 106, a match 108, another match 110, yet another match 112, a host computer 114, and a plasma chamber 116.

Examples of an RF generator, as used herein, include an RF generator having an operating frequency of 400 kilohertz (kHz), an RF generator having an operating frequency of 2 megahertz (MHz), an RF generator having an operating frequency of 27 MHz, and an RF generator having an operating frequency of 60 MHz. Examples of a match, as used herein, include an impedance matching circuit having a network of circuit components, such as inductors, resistors, capacitors. To illustrate, the match has one or more series circuits and one or more shunt circuits. Each series circuit includes one or more inductors and one or more capacitors that are coupled in series with each other. Similarly, each shunt circuit includes one or more inductors and one or more capacitors that are coupled in series with each other, and one of the one or more inductors and the one or more capacitors is coupled to a ground potential. Each of the one or more shunt circuits is coupled to a corresponding one of the one or more series circuits. The terms match, impedance matching circuit, and impedance matching network are used herein interchangeably.

Examples of a computer, as used herein, include a desktop computer, a laptop computer, a tablet, and a smart phone. Examples of the plasma chamber 116 include an inductively coupled plasma (ICP) chamber, which is sometimes also referred to herein as a TCP chamber.

The host computer 114 includes a processor 118 and a memory device 120. The processor 118 is coupled to the memory device 120. As used herein, a processor is an application specific integrated circuit (ASIC), or a programmable logic device (PLD), or a central processing unit (CPU), or a microprocessor, or a microcontroller. Examples of a memory device include a random access memory (RAM) and a read-only memory (ROM). To illustrate, a memory device is a flash memory, a hard disk, or a storage device, etc. A memory device is an example of a computer-readable medium.

The plasma chamber 116 includes a substrate support 122, a TCP coil 124, a TCP coil 126, and a dielectric window 128. The TCP coil 126 is an example of an inner TCP coil and the TCP coil 124 is an example of an outer TCP coil. The TCP coil 124 has a diameter that is greater than a diameter of the TCP coil 126. One end of each TCP coil 124 and 126 is coupled to a ground connection or a ground potential. The terms TCP coil and RF coil are used herein interchangeably. Examples of the substrate support 122 include a chuck, such as an electrostatic chuck (ESC). To illustrate, the chuck includes a metal base and a dielectric layer on top of the metal base. A substrate S, such as a semiconductor wafer, is placed on a top surface of the substrate support 122 to be processed within the plasma chamber 116.

The substrate support 122 includes a lower electrode, which is fabricated from a metal, such as aluminum or an alloy of aluminum. The lower electrode is embedded within the dielectric layer of the chuck. The lower electrode is sometimes referred to herein as a bias electrode.

The processor 118 is coupled via a cable system 130 to the source RF generator 102, which has an output 132 that is coupled via an RF cable 134 to an input 136 of the match 108. An output 138 of the match 108 is coupled via an RF transmission line 140 to one end of the TCP coil 126. An opposite end of the TCP coil 126 is coupled to a ground connection. Similarly, the processor 118 is coupled via a cable system 142 to the source RF generator 104, which has an output 144 that is coupled via an RF cable 146 to an input 148 of the match 110. An output 150 of the match 110 is coupled via an RF transmission line 152 to one end of the TCP coil 124. An opposite end of the TCP coil 124 is coupled to a ground connection. Also, the processor 118 is coupled via a cable system 154 to the bias RF generator 106, which has an output 156 that is coupled via an RF cable 158 to an input 160 of the match 112. An output 162 of the match 112 is coupled via an RF transmission line 164 to the lower electrode of the substrate support 122.

An example of a cable system, as used herein, includes one or more cables for transfer of data between the processor 118 and an RF generator, which is coupled via the one or more cables to the processor 118. The transfer of data can be in the serial manner, or in a parallel manner, or via a universal serial bus (USB) protocol. An example of an RF transmission line includes an RF rod and an RF sheath. The RF sheath surrounds the RF rod and an insulator material is placed between the RF rod and the RF sheath.

The processor 118 generates a process recipe signal 169, such as a digital pulsed signal, and sends the process recipe signal 169 via the cable system 154 to the bias RF generator 106. The process recipe signal 169 provides a duty cycle and a pulsing frequency of the parameter of an RF signal 172 to be generated by the bias RF generator 106. In addition, the processor 118 generates a synchronization signal 168, such as a clock signal, and sends the synchronization signal 168 via the cable system 154 to the bias RF generator 106. The synchronization signal 168 is sometimes referred to herein as a sync trigger signal.

After the process recipe signal 169 is received, upon receiving the synchronization signal 168, the bias RF generator 106 generates the RF signal 172 having the parameter that has the duty cycle and the pulsing frequency of the process recipe signal 169, and supplies the RF signal 172 at the output 156 of the bias RF generator 106. The RF signal 172 is supplied via the RF cable 158 to the input 160 of the match 112. The match 112 receives the RF signal 172 and matches an impedance of a load coupled to the output 162 of the match 112 with an impedance of a source coupled to the input 160 of the match 112 to modify an impedance of the RF signal 172 to output a modified RF signal 174. An example of the load coupled to the output 162 includes the RF transmission line 164 and the plasma chamber 116. An example of the source coupled to the input 160 includes the RF cable 158 and the bias RF generator 106. The modified RF signal 174 is transferred from the output 162 via the RF transmission line 164 to the lower electrode of the substrate support 122.

As an example, a parameter level of the modified RF signal 174 is within a predetermined range from a parameter level of the RF signal 172 based on which the modified RF signal 174 is generated. To illustrate, the modified RF signal 174 transitions from a first parameter level to a second parameter level during the same time period in which the RF signal 172 transitions from a third parameter level to a fourth parameter level. Similarly, the modified RF signal 174 transitions from the second parameter level to the first parameter level during the same time period in which the RF signal 172 transitions from the fourth parameter level to the third parameter level. The third parameter level is within the predetermined range from the first parameter level and the fourth parameter level is within the predetermined range from the second parameter level. To illustrate, the third parameter level is equal to the first parameter level and the fourth parameter level is equal to the second parameter. As another illustration, the third parameter level is greater than or lower than the first parameter level by one percent or two percent and the fourth parameter level is greater than or lower than the second parameter level by one percent or two percent.

Examples of a parameter level, as used herein, include a power level and a voltage level. Power and voltage are examples of a parameter. The parameter level of an RF signal includes one or more values, such as peak-to-peak amplitudes and zero-to-peak amplitudes, of the RF signal, and one or more values of the parameter level are different than one or more values of another parameter level of the RF signal. To illustrate, one or more parameter values of the first parameter level are exclusive from one or more parameter values of the second parameter level. To further illustrate, when the first parameter level is greater than the second parameter level, a minimum of the one or more parameter values of the first parameter level is greater than a maximum of the one or more parameter values of the second parameter level. Contrarily, when the first parameter level is lower than or less than the second parameter level, a maximum of the one or more parameter values of the first parameter level is less than a minimum of the one or more parameter values of the second parameter level.

The processor 118 generates a process recipe signal 176 and sends the process recipe signal 176 via the cable system 142 to the source RF generator 104. In addition, the processor 118 sends the synchronization signal 168 via the cable system 142 to the source RF generator 104. The process recipe signal 176 provides a duty cycle and a pulsing frequency of an RF signal 178 to be generated by the source RF generator 104. Upon receiving the process recipe signal 176 and the synchronization signal 168, the source RF generator 104 generates the RF signal 178 having the duty cycle and the pulsing frequency of the process recipe signal 176, and supplies the RF signal 178 at the output 144 of the source RF generator 104. The RF signal 178 is supplied via the RF cable 146 to the input 148 of the match 110. The match 110 receives the RF signal 178 and matches an impedance of a load coupled to the output 150 of the match 110 with an impedance of a source coupled to the input 148 of the match 110 to modify an impedance of the RF signal 178 to output a modified RF signal 180. An example of the load coupled to the output 150 includes the RF transmission line 152 and the plasma chamber 116. An example of the source coupled to the input 148 includes the RF cable 146 and the source RF generator 104. The modified RF signal 180 is transferred from the output 150 via the RF transmission line 152 to the TCP coil 124.

The processor 118 generates a process recipe signal 182 and sends the process recipe signal 182 via the cable system 130 to the source RF generator 102. The process recipe signal 182 provides a pulsing frequency and a duty cycle of the parameter of an RF signal 184 to be generated by the source RF generator 102. Also, the processor 118 sends the synchronization signal 168 via the cable system 130 to the source RF generator 102.

Upon receiving the process recipe signal 182 and the synchronization signal 168, the source RF generator 102 generates the RF signal 184 having the duty cycle and the pulsing frequency of the process recipe signal 182, and supplies the RF signal 184 at the output 132 of the source RF generator 102. The RF signal 184 is supplied via the RF cable 134 to the input 136 of the match 108. The match 108 receives the RF signal 184 and matches an impedance of a load coupled to the output 138 of the match 108 and with an impedance of a source coupled to the input 136 of the match 108 to modify an impedance of the RF signal 184 to output a modified RF signal 186. An example of the load coupled to the output 138 includes the RF transmission line 140 and the plasma chamber 116. An example of the source coupled to the input 136 includes the RF cable 134 and the source RF generator 102. The modified RF signal 186 is transferred from the output 138 via the RF transmission line 140 to the TCP coil 126.

Moreover, one or more process gases, such as, an oxygen containing gas, and a fluorine containing gas, are supplied to a gap between the dielectric window 128 and the substrate support 122. When the one or more process gases and the modified RF signals 174, 180, and 186 are supplied to the plasma chamber 116, plasma is stricken or maintained within the plasma chamber 116, and the plasma is used to process the substrate S. Examples of processing the substrate S include depositing one or more materials on the substrate S, or etching the substrate S, or cleaning the substrate S, or sputtering the substrate S, or a combination thereof.

In an embodiment, the bias RF generator 106 is a master RF generator and the RF generators 102 and 104 are slave RF generators. For example, the synchronization signal 168 is generated by a processor, such as a digital signal processor (DSP), of the bias RF generator 106, and sent via a first cable system to the source RF generator 102 and via a second cable system to the source RF generator 104. The processor 118 is coupled to the source RF generator 102 via the first cable system and is coupled to the source RF generator 104 via the second cable system.

In one embodiment, the TCP coil 124 is located in the same horizontal plane as the TCP coil 126. In an embodiment, the TCP coil 124 is located in a different horizontal plane, such as a horizontal plane that is at a higher horizontal level or a lower horizontal level, compared to a horizontal level of a horizontal plane in which the TCP coil 126 is located.

In an embodiment, a TCP coil, as used herein, has a different number of turns than that illustrated in FIG. 1A. For example, the TCP coil 124 or 126 has four turns or six turns or eight turns.

In one embodiment, the synchronization signal 168 is generated by a clock source, such as a clock oscillator, located within the host computer 114.

In one embodiment, instead of being located above the dielectric window 128, the TCP coil 124 or 126 is located on a side of the plasma chamber 116.

In an embodiment, in addition to the bias RF generator 106, one or two additional bias RF generators are coupled via the match 112 to the substrate support 122. For example, the bias RF generator 106 having an operating frequency of 2 MHz, an additional RF generator having an operating frequency of 27 MHz, and another additional RF generator having an operating frequency of 60 MHz are coupled via the match 112 to the substrate support 122. The one or two additional bias RF generators are also coupled via corresponding one or two cable systems to the processor 118.

Figure 1B:
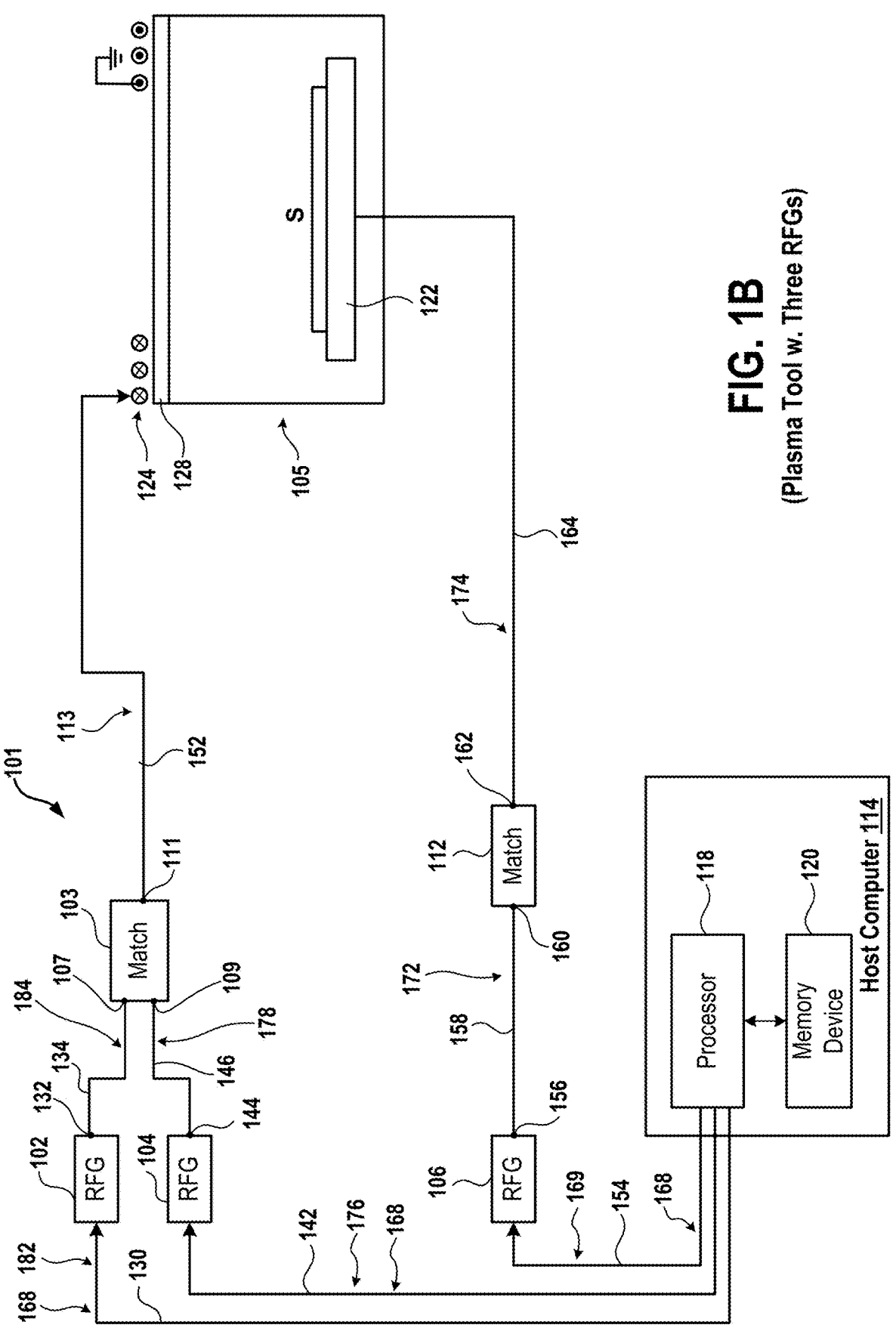
FIG. 1B is a diagram of an embodiment of a plasma system to illustrate RF generators that are coupled via a match to a TCP coil.

FIG. 1B is a diagram of an embodiment of a plasma system 101 to illustrate the RF generators 102 and 104 that are coupled via a match 103 to the TCP coil 124. The plasma system 101 includes the RF generators 102, 104, and 106, the match 103, the match 112, and a plasma chamber 105. The plasma system 101 is similar to the plasma system 100 (FIG. 1A) except that the plasma system 101 excludes the matches 108 and 110, and the TCP coil 126 (FIG. 1A). The plasma chamber 105 is similar in structure and function to the plasma chamber 116 (FIG. 1A) except that the plasma chamber 105 excludes the TCP coil 126.

The output 132 of the source RF generator 102 is coupled via the RF cable 134 to an input 107 of the match 103 and the output 144 of the source RF generator 104 is coupled via the RF cable 146 to an input 109 of the match 103. The input 107 is coupled via a first branch circuit to an output 111 of the match 103 and the input 109 is coupled via a second branch circuit to the output 111. As an example, each branch circuit includes a group of circuit components, such as one or more series circuits and one or more shunt circuits. The output 111 is coupled via the RF transmission line 152 to the TCP coil 124.

The RF signal 184 generated by the source RF generator 102 is received at the input 107 of the match 103 and the RF signal 178 generated by the source RF generator 104 is received at the input 109 of the match 103. The RF signal 184 is transferred via the first branch circuit of the match 103 and the first branch circuit modifies the impedance of the RF signal 184 to output a first modified RF signal. Similarly, the RF signal 178 is transferred via the second branch circuit of the match 103 and the second branch circuit modifies the impedance of the RF signal 178 to output a second modified RF signal. The first and second modified RF signals are combined, such as summed or added, at the output 111 of the match 103 to provide a modified RF signal 113 at the output 111. The modified RF signal 113 is transferred via the RF transmission line 152 to the TCP coil 124.

When the one or more process gases are supplied to the gap between the substrate support 122 and the dielectric window 128, the modified RF signal 113 is supplied to the TCP coil 124, and the modified RF signal 174 is supplied to the substrate support 122, plasma is stricken or maintained within the plasma chamber 105. The plasma within the plasma chamber 105 is used to process the substrate S within the plasma chamber 105.

FIG. 2A is an embodiment of a graph 200 to illustrate the process recipe signal 169, such as a digital pulsed signal, which is either generated by the bias RF generator 102 or is sent to the bias RF generator 102 by the processor 118 (FIG. 1A). The graph 200 plots the process recipe signal 169 versus time t. A logic level, such as 1 or 0, of the process recipe signal 169 is plotted on a y-axis of the graph 200 and the time t is plotted on an x-axis of the graph 200.

The time t ranges from a time t0 to a time t20, as illustrated in FIG. 2A. For example, the time t has the time t0, a time t1, a time t2, a time t3, a time t4, a time t5, a time t6, a time t7, a time t8, a time t9, a time t10, a time t11, a time 12, a time t13, a time 14, a time t15, a time t16, a time 17, a time t18, a time t19, and a time t20. Each time interval between any two consecutive times is the same. For example, a time interval between the times t0 and t2 is equal to a time interval between the times t2 and t4 and a time interval between the times t4 and t6. As another example, a time interval between the times t0 and t1 is the same as a time interval between the times t1 and t2 and a time interval between the times t2 and t3.

During a cycle 1 of the synchronization signal 168, the process recipe signal 169 transitions from the logic level 0 to the logic level 1 at the time t0, and has the logic level 1 from the time t0 to the time t4. Also, during the cycle 1 of the synchronization signal 168, the process recipe signal 169 transitions from the logic level 1 to the logic level 0 at the time t4 and has the logic level 0 from the time t4 to the time t8.

The process recipe signal 169 repeats the logic levels 1 and 0 during a cycle 2 of the synchronization signal 168. For example, during the cycle 2 of the synchronization signal 168, the process recipe signal 169 transitions from the logic level 0 to the logic level 1 at the time t8 and has the logic level 1 from the time t8 to the time t12. Also, during the cycle 2 of the synchronization signal 168, the process recipe signal 169 transitions from the logic level 1 to the logic level 0 at the time t12 and has the logic level 0 from the time t12 to the time t16.

The cycle 2 of the synchronization signal 168 is consecutive to the cycle 1 of the synchronization signal 168. For example, there are no other cycles between the cycles 1 and 2 of the synchronization signal 168.

The process recipe signal 169 has states S1 and S0. For example, when the process recipe signal 169 has the logic level 1, the process recipe signal 169 has the state S1 and when the process recipe signal 169 has the logic level 0, the process recipe signal 169 has the state S0. To illustrate, during the cycle 1 of the synchronization signal 168, the process recipe signal 169 has the state S1 during a time period between the times t0 and t4 and has the state S0 during a time period between the times t4 and t8. During the cycle 1 of the synchronization signal 168, the process recipe signal 169 transitions at the time t0 from the state S0 to the state S1 and transitions from the state S1 to the state S0 at the time t4. Similarly, the states S1 and S0 of the process recipe signal 169 repeat during the cycle 2 of the synchronization signal 168.

FIG. 2B is an embodiment of the graph 204 to illustrate a parameter 206 of the RF signal 172 (FIG. 1A) versus the time t. The graph 204 plots the parameter 206 on a y-axis and the time t on an x-axis. During the cycle 1 of the synchronization signal 168, the parameter 206 transitions or pulses at the time t0 from a parameter level zero to parameter levels PRa and PR-a, remains at the parameter levels PRa and PR-a during a time period between the times t0 and t4, transitions at the time t4 from the parameter levels PRa and PR-a to the parameter level zero, and remains at the parameter level zero during a time period between the times t4 and t8, where a is an integer greater than zero. It should be noted that the terms pulses or transitions are used herein interchangeably. Also, the terms pulsing or transitioning are used herein interchangeably. The parameter level PRa is greater than the parameter level zero, which is greater than the parameter level PR-a. For example, the parameter level PRa is a positive parameter level and the parameter level PR-a is a negative parameter level.

The parameter levels PRa, PR-a, and zero repeat during the cycle 2 of the synchronization signal 168. For example, during the cycle 2 of the synchronization signal 168, the parameter 206 transitions at the time t8 from the parameter level zero to the parameter levels PRa and PR-a, remains at the parameter levels PRa and PR-a during a time period between the times t8 and t12, transitions at the time t12 from the parameter levels PRa and PR-a to the parameter level zero, and remains at the parameter level zero during a time period between the times t12 and t16. The parameter levels PRa and PR-a represent a state S1 of the RF signal 172 and the parameter level zero represents a state S0 of the RF signal 172.

As such, the parameter 206 of the RF signal 172 transitions during the cycles 1 and 2 of the synchronization signal 168 between the parameter levels PRa and zero at a pulsing frequency. For example, two pulses of the parameter 206 of the RF signal 172 are generated during the cycles 1 and 2 of the synchronization signal 168 or one pulse of the parameter 206 of the RF signal 172 is generated during each cycle of the synchronization signal 168 to generate the pulsing frequency of the RF signal 172. As another example, the parameter 206 has a pulsing frequency that ranges from 100 hertz to 1000 hertz in integer multiples of 100 hertz. To illustrate, the parameter 206 has a pulsing frequency of 100 hertz, or 200 hertz, and so on until 1000 hertz.

The parameter 206 has a duty cycle of 50%. For example, the parameter 206 has the parameter levels PRa and PR-a during a time period between the times t0 and t4 during the cycle 1 of the synchronization signal 168 and has the parameter level zero during a time period between the times t4 and t8 during the cycle 1 of the synchronization signal 168. The time period between the times t0 and t4 is half or 50% of the time period between the times t0 and t8. Similarly, the parameter 206 has the parameter levels PRa and PR-a during a time period between the times t8 and t12 during the cycle 2 of the synchronization signal 168 and has the parameter level zero during a time period between the times t12 and t16 during the cycle 2 of the synchronization signal 168. The time period between the times t8 and t12 is half or 50% of the time period between the times t8 and t16.

In one embodiment, instead of transitioning to the parameter level zero, a parameter, described herein, transitions to a parameter level that is greater than zero. For example, the parameter 206 transitions from the parameter levels PRa and PR-a to parameter levels PRx and PR-x, where x is an integer less than a and greater than zero. As another example, x is an integer greater than a.

In one embodiment, instead of the parameter 206 that is pulsed to transition from the two parameter levels PRa or PR-a to the parameter level zero and vice versa, a parameter of a continuous wave (CW) RF signal is generated. For example, in response to receiving the synchronization signal 168, the bias RF generator 106 generates a continuous wave RF signal. To illustrate, a continuous wave RF signal does not have multiple parameter levels. Rather, the continuous wave RF signal has a single parameter level, which is zero or greater than zero. To further illustrate, parameter values of the single parameter level of the continuous wave RF signal are within a predetermined range, such as within ±5% from an average or a median of the parameter values. The average or the median of the parameter values is an example of a statistical value.

In one embodiment, during the cycle 1 of the synchronization signal 168, the bias RF generator 106 is on for a different time period than that illustrated in FIG. 2B and is off for a different time period than that illustrated in FIG. 2B. For example, during the cycle 1 of the synchronization signal 168, the bias RF generator 106 has a duty cycle (DC) that ranges from 10% to 90%. To illustrate, the RF signal 172 has the parameter levels PRa and PR-a during a time period between the times t0 and t5, and has the parameter level zero during a time period between the times t5 and t8. The parameter 206 transitions from the parameter level zero to the parameter levels PRa and PR-a at the time t0, and transitions from the parameter levels PRa and PR-a to the parameter level zero at the time t5. The RF signal 172 repeats the transitions from the parameter levels PRa and PR-a to zero and from the parameter level zero to the parameter levels PRa and PR-a during the cycle 2 of the synchronization signal 168 in the same manner in which the RF signal 172 transitions from the parameter levels PRa and PR-a to zero and vice versa during the cycle 1 of the synchronization signal 168.

In an embodiment, instead of a parameter level zero of the parameter of an RF signal, parameter levels of substantially zero are achieved. The parameter levels of substantially zero include a positive parameter level and a negative parameter level. The positive parameter level is greater than the parameter level zero by a pre-determined amount, such as within a range of 5% from the parameter level zero. The negative parameter level is less than the parameter level zero by the pre-determined amount.

In an embodiment, a bias pulse cycle of the parameter 206 starts at the time t0 and ends at the time t8. Another bias pulse cycle of the parameter 206 starts at the time t8 and ends at the time t16.

FIG. 2C is an embodiment of a graph 208 to illustrate a digital pulsed signal 210 that is either generated by the source RF generator 102 (FIG. 1A) or is sent to the source RF generator 102 by the processor 118. The digital pulsed signal 210 is an example of the process recipe signal 182 (FIG. 1A).

The graph 208 plots the digital pulsed signal 210 versus the time t. A logic level, such as 1 or 0, of the digital pulsed signal 210 is plotted on a y-axis of the graph 208 and the time t is plotted on an x-axis of the graph 208. During the cycle 1 of the synchronization signal 168, the digital pulsed signal 210 transitions from the logic level 0 to the logic level 1 at the time t0 and has the logic level 1 from the time t0 to the time t2. Also, during the cycle 1 of the synchronization signal 168, the digital pulsed signal 210 transitions from the logic level 1 to the logic level 0 at the time t2 and has the logic level 0 from the time t2 to the time t4. During the cycle 1 of the synchronization signal 168, the digital pulsed signal 210 transitions from the logic level 0 to the logic level 1 at the time t4 and has the logic level 1 from the time t4 to the time t6. Also, during the cycle 1 of the synchronization signal 168, the digital pulsed signal 210 transitions from the logic level 1 to the logic level 0 at the time t6 and has the logic level 0 from the time t6 to the time t8.

The digital pulsed signal 210 repeats the logic levels 1 and 0 during the cycle 2 of the synchronization signal 168. For example, during the cycle 2 of the synchronization signal 168, the digital pulsed signal 210 transitions from the logic level 0 to the logic level 1 at the time t8 and has the logic level 1 from the time t8 to the time t10. Also, during the cycle 2 of the synchronization signal 168, the digital pulsed signal 210 transitions from the logic level 1 to the logic level 0 at the time t10 and has the logic level 0 from the time t10 to the time t12. During the cycle 2 of the synchronization signal 168, the digital pulsed signal 210 transitions from the logic level 0 to the logic level 1 at the time t12 and has the logic level 1 from the time t12 to the time t14. Also, during the cycle 2 of the synchronization signal 168, the digital pulsed signal 210 transitions from the logic level 1 to the logic level 0 at the time t14 and has the logic level 0 from the time t14 to the time t16.

The digital pulsed signal 210 has states S1 and S0. For example, when the digital pulsed signal 210 has the logic level 1, the digital pulsed signal 210 has the state S1 and when the digital pulsed signal 210 has the logic level 0, the digital pulsed signal 210 has the state S0. To illustrate, during the cycle 1 of the synchronization signal 168, the digital pulsed signal 210 has the state S1 during a time period between the times t0 and t2, has the state S0 during a time period between the times t2 and t4, has the state S1 during a time period between the times t4 and t6, and has the state S0 during a time period between the times t6 and t8. During the cycle 1 of the synchronization signal 168, the digital pulsed signal 210 transitions at the time t0 from the state S0 to the state S1, transitions from the state S1 to the state S0 at the time t2, transitions from the state S0 to the state S1 at the time t4, and transitions from the state S1 to the state S0 at the time t6. Similarly, the states S1 and S0 of the digital pulsed signal 210 repeat during the cycle 2 of the synchronization signal 168.

FIG. 2D is an embodiment of a graph 212 to illustrate a parameter 214 of the RF signal 184 (FIG. 1A) versus the time t. The graph 212 plots the parameter 214 on a y-axis and the time t on an x-axis. During the cycle 1 of the synchronization signal 168, the parameter 214 transitions at the time t0 from the parameter level zero to parameter levels PRb and PR-b, remains at the parameter levels PRb and PR-b during a time period between the times t0 and t2, transitions at the time t2 from the parameter levels PRb and PR-b to the parameter level zero, and remains at the parameter level zero during a time period between the times t2 and t4, where b is an integer greater than zero. For example, the integer b is greater than or less than the integer a, and greater than zero. Also, during the cycle 1 of the synchronization signal 168, the parameter 214 transitions at the time t4 from the parameter level zero to parameter levels PRb and PR-b, remains at the parameter levels PRb and PR-b during a time period between the times t4 and t6, transitions at the time t6 from the parameter levels PRb and PR-b to the parameter level zero, and remains at the parameter level zero during a time period between the times t6 and t8.

The parameter levels PRb, PR-b, and zero repeat during the cycle 2 of the synchronization signal 168. For example, during the cycle 2 of the synchronization signal 168, the parameter 214 transitions at the time t8 from the parameter level zero to the parameter levels PRb and PR-b, remains at the parameter levels PRb and PR-b during a time period between the times t8 and t10, transitions at the time t10 from the parameter levels PRb and PR-b to the parameter level zero, and remains at the parameter level zero during a time period between the times t10 and t12. Also, during the cycle 2 of the synchronization signal 168, the parameter 214 transitions at the time t12 from the parameter level zero to the parameter levels PRb and PR-b, remains at the parameter levels PRb and PR-b during a time period between the times t12 and t14, transitions at the time t14 from the parameter levels PRb and PR-b to the parameter level zero, and remains at the parameter level zero during a time period between the times t14 and t16. The parameter levels PRb and PR-b represent a state S1 of the RF signal 184 and the parameter level zero represents a state S0 of the RF signal 184.

As such, the parameter of the RF signal 184 transitions during the cycles 1 and 2 of the synchronization signal 168 between the parameter levels PRb and zero at a pulsing frequency. For example, four pulses of the parameter of the RF signal 184 are generated during the cycles 1 and 2 of the synchronization signal 168 or two pulses of the parameter of the RF signal 184 is generated during each cycle of the of the synchronization signal 168 to generate the pulsing frequency of the RF signal 184.

It should be noted that the pulsing frequency of the parameter of the RF signal 184 is greater than the pulsing frequency of the parameter of the RF signal 172. For example, two pulses of the parameter of the RF signal 184 are generated during each cycle of the synchronization signal 168 in which one pulse of the parameter of the RF signal 172 is generated. As another example, the pulsing frequency of the parameter of the RF signal 184 is an integer multiple, such as two or three or four, of the pulsing frequency of the parameter of the RF signal 172. To illustrate, when the pulsing frequency of the parameter of the RF signal 172 is one, the pulsing frequency of the parameter of the RF signal 184 is two or five or eight. As another illustration, when the pulsing frequency of the parameter of the RF signal 172 is two, the pulsing frequency of the parameter of the RF signal 184 is six or ten. As another example, the parameter 214 has a pulsing frequency that is an integer multiple of the pulsing frequency of the parameter 206 (FIG. 2B). To illustrate, when the pulsing frequency of the parameter 206 is 100 hertz, the pulsing frequency of the parameter 214 ranges from 200 hertz to 10,000 hertz. To further illustrate, when the pulsing frequency of the parameter 206 is 100 hertz, the pulsing frequency of the parameter 214 is 200 hertz or 300 hertz or 400 hertz and so on until 10,000 hertz.

It should further be noted that the time t0 is a start time of pulsing of the parameter of an RF signal, such as the RF signal 172 or 184 or 178, during the cycle 1 of the synchronization signal 168 and the time t8 is an end time of pulsing of the parameter of the RF signal during the cycle 1 of the synchronization signal 168. Similarly, the time t8 is a start time of pulsing of the parameter of the RF signal during the cycle 2 of the pulse recipe signal 169 and the time t16 is an end time of pulsing of the parameter of the RF signal during the cycle 2.

When the parameters of the RF signals 172 and 184 transition simultaneously, e.g., at the time t0, during the cycle 1 of the synchronization signal 168, the parameters are pulsed in a synchronized manner at the start time t0 and the start times t0 of transitioning of the parameters of the RF signals 172 and 184 are synchronized with each other. Similarly, when the parameters of the RF signals 172 and 184 transition simultaneously, e.g., at the time t8, during the cycle 1 of the synchronization signal 168, the parameters are pulsed in a synchronized manner at the end time t8 and the end times t8 of transitioning of the parameters of the RF signals 172 and 184 are synchronized with each other.

Also, when the parameters of the RF signals 172 and 184 transition simultaneously, e.g., at the time t8, during the cycle 2 of the pulse recipe signal 169, the parameters are pulsed in a synchronized manner at the start time t8 and the start times t8 of transitioning of the parameters of the RF signals 172 and 184 are synchronized with each other. Similarly, when the parameters of the RF signals 172 and 184 transition simultaneously, e.g., at the time t16, during the cycle 2 of the pulse recipe signal 169, the parameters are pulsed in a synchronized manner at the end time t16 and the end times t16 of transitioning of the parameters of the RF signals 172 and 184 are synchronized with each other.

The parameter 214 has a duty cycle of 50%. For example, the parameter 214 has the parameter levels PRb and PR-b during a time period between the times t0 and t2 during the cycle 1 of the synchronization signal 168 and has the parameter level zero during a time period between the times t2 and t4 during the cycle 1 of the synchronization signal 168. The time period between the times t0 and t2 is half or 50% of the time period between the times t1 and t4. Similarly, the parameter 214 has the parameter levels PRb and PR-b during a time period between the times t8 and t10 during the cycle 2 of the synchronization signal 168 and has the parameter level zero during a time period between the times t10 and t12 during the cycle 2 of the synchronization signal 168. The time period between the times t8 and t10 is half or 50% of the time period between the times t8 and t12.

In an embodiment, the parameter 214 has a duty cycle different from a duty cycle of the parameter 206. For example, the parameter 214 has a duty cycle that ranges from 10% to 90% and the parameter 206 has a duty cycle that ranges from 10% to 90%. To illustrate, the parameter 214 has a duty cycle of 60% and the parameter 206 has a duty cycle of 50%. As another illustration, during the cycle 1 of the synchronization signal 168, the parameter 214 pulses from the parameter level zero to the parameter levels PRb and PR-b at the time t0, remains at the parameter levels PRb and PR-b from the time t0 to the time t1, and transitions from the parameter levels PRb and PR-b to the parameter level zero at the time t1, and remains at the parameter level zero from the time t1 to the time t4 to have a duty cycle of 20%. Also, the parameter 214 pulses from the parameter level zero to the parameter levels PRb and PR-b at the time t4, remains at the parameter levels PRb and PR-b from the time t4 to the time t5, and transitions from the parameter levels PRb and PR-b to the parameter level zero at the time t5, and remains at the parameter level zero from the time t5 to the time t8 to have the duty cycle of 20%.

In one embodiment, instead of transitioning to the parameter level zero, a parameter, described herein, transitions to a parameter level that is greater than zero. For example, the parameter 214 transitions from the parameter levels PRb and PR-b to parameter levels PRy and PR-y, where y is an integer less than b and greater than zero. As another example, y is an integer greater than b.

In one embodiment, the parameter 214 is pulsed at a frequency that is a greater integer multiple of a frequency of pulsing of the parameter 206 (FIG. 2B) than an integer multiple of two illustrated in FIG. 2D. For example, a frequency of occurrence of the parameter levels PRb and PR-b is greater than that illustrated in FIG. 2D. To illustrate, during the cycle 1 of the synchronization signal 168, the parameter 214 transitions at the time t0 from the parameter level zero to parameter levels PRb and PR-b, remains at the parameter levels PRb and PR-b during a time period between the times t0 and t1, transitions at the time t1 from the parameter levels PRb and PR-b to the parameter level zero, and remains at the parameter level zero during a time period between the times t1 and t2. Also, during the cycle 1 of the synchronization signal 168, the parameter 214 transitions at the time t2 from the parameter level zero to parameter levels PRb and PR-b, remains at the parameter levels PRb and PR-b during a time period between the times t2 and t3, transitions at the time t3 from the parameter levels PRb and PR-b to the parameter level zero, and remains at the parameter level zero during a time period between the times t3 and t4. Further, during the cycle 1 of the synchronization signal 168, the parameter 214 transitions at the time t4 from the parameter level zero to parameter levels PRb and PR-b, remains at the parameter levels PRb and PR-b during a time period between the times t4 and t5, transitions at the time t5 from the parameter levels PRb and PR-b to the parameter level zero, and remains at the parameter level zero during a time period between the times t5 and t6. During the cycle 1 of the synchronization signal 168, the parameter 214 transitions at the time t6 from the parameter level zero to parameter levels PRb and PR-b, remains at the parameter levels PRb and PR-b during a time period between the times t6 and t7, transitions at the time t7 from the parameter levels PRb and PR-b to the parameter level zero, and remains at the parameter level zero during a time period between the times t7 and t8 to have a pulsing frequency of four pulses of the parameter of the RF signal 184. The parameter levels PRb, PR-b, and zero repeat during the cycle 2 of the synchronization signal 168 with the greater pulsing frequency. Also, in this example, instead of the digital pulsed signal 210, a digital pulsed signal that has the same frequency as the greater frequency of pulsing of the parameter 214 is used.

In an embodiment, instead of the parameter 214 that is pulsed to transition from the two parameter levels PRb or PR-b to the parameter level zero and vice versa, a parameter of a continuous wave RF signal is generated. For example, in response to receiving the synchronization signal 168, the source RF generator 102 generates a continuous wave RF signal. In this embodiment, the digital pulsed signal 210 is not generated by the processor 118.

In an embodiment, the parameter 214 is of the RF signal 172 and the parameter 206 (FIG. 2B) is of the RF signal 184. Also, in this embodiment, the pulse recipe signal 169 is sent to the source RF generator 102 to generate the RF signal 184 having the parameter 206 and the digital pulsed signal 210 is sent to the bias RF generator 106 to generate the RF signal 172 having the parameter 214.

In an embodiment, a first TCP pulse cycle of the parameter 214 starts at the time t0 and ends at the time t4. A second TCP pulse cycle of the parameter 214 starts at the time t4 and ends at the time t8. A third TCP pulse cycle of the parameter 214 starts at the time t8 and ends at the time t12. A fourth TCP pulse cycle of the parameter 214 starts at the time t12 and ends at the time t16.

FIG. 2E embodiment of a graph 216 to illustrate a digital pulsed signal 218 that is either generated by the source RF generator 104 (FIG. 1A) or is sent to the source RF generator 104 by the processor 118. The digital pulsed signal 210 is an example of the process recipe signal 176 (FIG. 1A).

The graph 216 plots the digital pulsed signal 218 versus the time t. A logic level, such as 1 or 0, of the digital pulsed signal 218 is plotted on a y-axis of the graph 216 and the time t is plotted on an x-axis of the graph 216. The digital pulsed signal 218 is reversely synchronized or asynchronized with the digital pulsed signal 210 (FIG. 2C). For example, during the cycle 1 of the synchronization signal 168, the digital pulsed signal 218 transitions from the logic level 1 to the logic level 0 at the time t0 and has the logic level 0 from the time t0 to the time t2. Also, during the cycle 1 of the synchronization signal 168, the digital pulsed signal 218 transitions from the logic level 0 to the logic level 1 at the time t2 and has the logic level 1 from the time t2 to the time t4. During the cycle 1 of the synchronization signal 168, the digital pulsed signal 218 transitions from the logic level 1 to the logic level 0 at the time t4 and has the logic level 0 from the time t4 to the time t6. Also, during the cycle 1 of the synchronization signal 168, the digital pulsed signal 218 transitions from the logic level 0 to the logic level 1 at the time t6 and has the logic level 1 from the time t6 to the time t8.

The digital pulsed signal 218 repeats the logic levels 0 and 1 during the cycle 2 of the synchronization signal 168. For example, during the cycle 2 of the synchronization signal 168, the digital pulsed signal 218 transitions from the logic level 1 to the logic level 0 at the time t8 and has the logic level 0 from the time t8 to the time t10. Also, during the cycle 2 of the synchronization signal 168, the digital pulsed signal 218 transitions from the logic level 0 to the logic level 1 at the time t10 and has the logic level 1 from the time t10 to the time t12. During the cycle 2 of the synchronization signal 168, the digital pulsed signal 210 transitions from the logic level 1 to the logic level 0 at the time t12 and has the logic level 0 from the time t12 to the time t14. Also, during the cycle 1 of the synchronization signal 168, the digital pulsed signal 210 transitions from the logic level 0 to the logic level 1 at the time t14 and has the logic level 1 from the time t14 to the time t16.

The digital pulsed signal 218 has states S1 and S0. For example, when the digital pulsed signal 218 has the logic level 1, the digital pulsed signal 218 has the state S1 and when the digital pulsed signal 218 has the logic level 0, the digital pulsed signal 218 has the state S0. To illustrate, during the cycle 1 of the synchronization signal 168, the digital pulsed signal 218 has the state S0 during a time period between the times t0 and t2, has the state S1 during a time period between the times t2 and t4, has the state S0 during a time period between the times t4 and t6, and has the state S1 during a time period between the times t6 and t8. During the cycle 1 of the synchronization signal 168, the digital pulsed signal 218 transitions at the time t0 from the state S1 to the state S0, transitions from the state S0 to the state S1 at the time t2, transitions from the state S1 to the state S0 at the time t4, and transitions from the state S0 to the state S1 at the time t6. Similarly, the states S1 and S0 of the digital pulsed signal 218 repeat during the cycle 2 of the synchronization signal 168.

FIG. 2F is an embodiment of a graph 220 to illustrate a parameter 222 of the RF signal 178 (FIG. 1A) versus the time t. The graph 220 plots the parameter 222 on a y-axis and the time t on an x-axis. During the cycle 1 of the synchronization signal 168, the parameter 222 transitions at the time t0 from parameter levels PRc and PR-c to the parameter level zero, remains at the parameter level 0 during a time period between the times t0 and t2, transitions at the time t2 from the parameter level zero to the parameter levels PRc and PR-c, and remains at the parameter levels PRc and PR-c during a time period between the times t2 and t4, where c is an integer greater than zero. For example, the integer c is greater than or less than the integer a, and greater than zero. As another example, the integer c is greater than or less than the integer b, and greater than zero. Also, during the cycle 1 of the synchronization signal 168, the parameter 222 transitions at the time t4 from the parameter levels PRc and PR-c to the parameter level zero, remains at the parameter level zero during a time period between the times t4 and t6, transitions at the time t6 from the parameter level zero to the parameter levels PRc and PR-c, and remains at the parameter levels PRc and PR-c during a time period between the times t6 and t8.

The parameter levels PRc, PR-c, and zero repeat during the cycle 2 of the synchronization signal 168. For example, during the cycle 2 of the synchronization signal 168, the parameter 222 transitions at the time t8 from the parameter levels PRc and PR-c to the parameter level zero, remains at the parameter level zero during a time period between the times t8 and t10, transitions at the time t10 from the parameter level zero to the parameter levels PRc and PR-c, and remains at the parameter levels PRc and PR-c during a time period between the times t10 and t12. Also, during the cycle 2 of the synchronization signal 168, the parameter 222 transitions at the time t12 from parameter levels PRc and PR-c to the parameter level zero, remains at the parameter level zero during a time period between the times t12 and t14, transitions at the time t14 from the parameter level zero to the parameter levels PRc and PR-c, and remains at the parameter levels PRc and PR-c during a time period between the times t14 and t16. The parameter levels PRc and PR-c represent a state S1 of the RF signal 178 and the parameter level zero represents a state S0 of the RF signal 178.

As such, the parameter of the RF signal 178 transitions during the cycles 1 and 2 of the synchronization signal 168 between the parameter levels PRc and zero at a pulsing frequency. For example, four pulses of the parameter of the RF signal 178 are generated during the cycles 1 and 2 of the synchronization signal 168 or two pulses of the parameter of the RF signal 178 is generated during each cycle of the synchronization signal 168 to generate the pulsing frequency of the RF signal 178.

It should be noted that the pulsing frequency of the parameter of the RF signal 178 is greater than the pulsing frequency of the parameter of the RF signal 172 (FIG. 2B).

For example, two pulses of the parameter of the RF signal 178 are generated during each cycle of the process recipe signal 168 in which one pulse of the parameter of the RF signal 172 is generated. As another example, the pulsing frequency of the parameter of the RF signal 178 is an integer multiple, such as two or three or four, of the pulsing frequency of the parameter of the RF signal 172. To illustrate, when the pulsing frequency of the parameter of the RF signal 172 is one, the pulsing frequency of the parameter of the RF signal 178 is two or five or eight. As another illustration, when the pulsing frequency of the parameter of the RF signal 172 is two, the pulsing frequency of the parameter of the RF signal 178 is six or ten. As another example, the parameter 222 has a pulsing frequency that is an integer multiple of the pulsing frequency of the parameter 206. To illustrate, when the pulsing frequency of the parameter 206 is 100 hertz, the pulsing frequency of the parameter 222 ranges from 200 hertz to 10,000 hertz. To further illustrate, when the pulsing frequency of the parameter 206 is 100 hertz, the pulsing frequency of the parameter 222 is 200 hertz or 300 hertz or 400 hertz and so on until 10,000 hertz.

When the parameters of the RF signals 172 and 178 transition simultaneously, e.g., at the time t0, during the cycle 1 of the synchronization signal 168, the parameters are pulsed in a synchronized manner at the start time t0 and the start times t0 of transitioning of the parameters of the RF signals 172 and 178 are synchronized with each other. Similarly, when the parameters of the RF signals 172 and 178 transition simultaneously, e.g., at the time t8, during the cycle 1 of the synchronization signal 168, the parameters are pulsed in a synchronized manner at the end time t8 and the end times t8 of transitioning of the parameters of the RF signals 172 and 178 are synchronized with each other.

Also, when the parameters of the RF signals 172 and 178 transition simultaneously, e.g., at the time t8, during the cycle 2 of the pulse recipe signal 169, the parameters are pulsed in a synchronized manner at the start time t8 and the start times t8 of transitioning of the parameters of the RF signals 172 and 178 are synchronized with each other. Similarly, when the parameters of the RF signals 172 and 178 transition simultaneously, e.g., at the time t16, during the cycle 2 of the pulse recipe signal 169, the parameters are pulsed in a synchronized manner at the end time t16 and the end times t16 of transitioning of the parameters of the RF signals 172 and 178 are synchronized with each other.

The parameter 222 has a duty cycle of 50%. For example, the parameter 222 has the parameter level zero during a time period between the times t0 and t2 during the cycle 1 of the synchronization signal 168 and has the parameter levels PRc and PR-c during a time period between the times t2 and t4 during the cycle 1 of the synchronization signal 168. The time period between the times t0 and t2 is half or 50% of the time period between the times t0 and t4. Similarly, the parameter 222 has the parameter level zero during a time period between the times t8 and t10 during the cycle 2 of the synchronization signal 168 and has the parameter levels PRc and PR-c during a time period between the times t10 and t12 during the cycle 2 of the synchronization signal 168. The time period between the times t8 and t10 is half or 50% of the time period between the times t8 and t12.

In an embodiment, the parameter 222 has a duty cycle different from a duty cycle of the parameter 206. For example, the parameter 222 has a duty cycle that ranges from 10% to 90% and the parameter 206 has a duty cycle that ranges from 10% to 90%. To illustrate, the parameter 222 has a duty cycle of 70% and the parameter 206 has a duty cycle of 40%. Also, the parameter 222 has a higher pulsing frequency than a pulsing frequency of the parameter 206. To illustrate, during the cycle 1 of the synchronization signal 168, the parameter 222 pulses from the parameter levels PRc and PR-c to the parameter level zero at the time t0, remains at the parameter level zero from the time t0 to the time t1, and transitions from the parameter level zero to the parameter levels PRb and PR-b at the time t1, and remains at the parameter levels PRb and PR-b from the time t1 to the time t4 to have a duty cycle of 80%. Also, the parameter 222 pulses from the parameter levels PRc and PR-c to the parameter level zero at the time t4, remains at the parameter level zero from the time t4 to the time t5, and transitions from the parameter level zero to the parameter levels PRb and PR-b at the time t5, and remains at the parameter levels PRb and PR-b from the time t5 to the time t8 to have the duty cycle of 80%.

In one embodiment, the pulsing frequency of the parameter 222 of the RF signal 178 is different from, such as greater than or less than, the pulsing frequency of the parameter 214 of the RF signal 184. For example, three pulses of the parameter 222 of the RF signal 178 are generated during each cycle of the synchronization signal 168 in which two pulses of the parameter 214 of the RF signal 184 are generated. As another example, two pulses of the parameter 222 of the RF signal 178 are generated during each cycle of the synchronization signal 168 in which three pulses of the parameter 214 of the RF signal 184 are generated.

In an embodiment, a duty cycle of the parameter 222 of the RF signal 178 is different from, such as greater than or less than, the duty cycle of the parameter 214 of the RF signal 184. For example, the parameter 222 has a duty cycle of 20% and the parameter 214 has a duty cycle of 50%. As another example, the parameter 222 has a duty cycle of 50% and the parameter 214 has a duty cycle of 20%.

In one embodiment, instead of transitioning to the parameter level zero, a parameter, described herein, transitions to a parameter level that is greater than zero. For example, the parameter 222 transitions from the parameter levels PRc and PR-c to parameter levels PRz and PR-z, where z is an integer less than c and greater than zero. As another example, z is an integer greater than c.

In an embodiment, the digital pulsed signal 210 (FIG. 2C) is an example of the process recipe signal 176 (FIG. 1A) and the digital pulsed signal 218 (FIG. 2E) is an example of the process recipe signal 182 (FIG. 1A). In the embodiment, the parameter 214 (FIG. 2D) is a parameter of the RF signal 178 (FIG. 1A) and the parameter 222 is a parameter of the RF signal 184 (FIG. 1A).

In one embodiment, the parameter 222 is pulsed at a frequency that is a greater integer multiple of a frequency of pulsing the parameter 206 (FIG. 2B) than an integer multiple illustrated in FIG. 2F. As illustrated in FIG. 2F, the integer multiple at which the parameter 222 is pulsed with respect to the pulsing of the parameter 206 is two. For example, a frequency of occurrence of the parameter levels PRc and PR-c is greater than that illustrated in FIG. 2F. To illustrate, during the cycle 1 of the synchronization signal 168, the parameter 222 transitions at the time t0 from the parameter levels PRc and PR-c to the parameter level zero, remains at the parameter level zero during a time period between the times t0 and t1, transitions at the time t1 from the parameter level zero to the parameter levels PRc and PR-c, and remains at the parameter levels PRc and PR-c during a time period between the times t1 and t2. Also, during the cycle 1 of the synchronization signal 168, the parameter 222 transitions at the time t2 from the parameter levels PRc and PR-c to the parameter level zero, remains at the parameter level zero during a time period between the times t2 and t3, transitions at the time t3 from the parameter level zero to the parameter levels PRc and PR-c, and remains at the parameter levels PRc and PR-c during a time period between the times t3 and t4. Further, during the cycle 1 of the synchronization signal 168, the parameter 222 transitions at the time t4 from the parameter levels PRc and PR-c to the parameter level zero, remains at the parameter level zero during a time period between the times t4 and t5, transitions at the time t5 from the parameter level zero to the parameter levels PRc and PR-c, and remains at the parameter levels PRc and PR-c during a time period between the times t5 and t6. During the cycle 1 of the synchronization signal 168, the parameter 222 transitions at the time t6 from the parameter levels PRc and PR-c to the parameter level zero, remains at the parameter level zero during a time period between the times t6 and t7, transitions at the time t7 from the parameter level zero to the parameter levels PRc and PR-c, and remains at the parameter levels PRc and PR-c during a time period between the times t7 and t8 to achieve a pulsing frequency of four. The parameter levels PRc, PR-b, and zero repeat during the cycle 2 of the synchronization signal 168 with the greater pulsing frequency. Also, instead of the digital pulsed signal 218, a digital pulsed signal that has the same frequency as the greater frequency of pulsing of the parameter 222 is used.

In one embodiment, instead of the parameter 222 that is pulsed to transition from the two parameter levels PRc or PR-c to the parameter level zero and vice versa, a parameter of a continuous wave RF signal is generated. For example, in response to receiving the synchronization signal 168, the source RF generator 104 generates a continuous wave RF signal. In this embodiment, the digital pulsed signal 218 is not generated by the processor 118.

In an embodiment, a first TCP pulse cycle of the parameter 222 starts at the time t0 and ends at the time t4. A second TCP pulse cycle of the parameter 222 starts at the time t4 and ends at the time t8. A third TCP pulse cycle of the parameter 222 starts at the time t8 and ends at the time t12. A fourth TCP pulse cycle of the parameter 222 starts at the time t12 and ends at the time t16.

In one embodiment, the parameter 222 is synchronized with the parameter 214 (FIG. 2D) instead of being asynchronized with the parameter 214. For example, during the cycle 1 of the synchronization signal 168, the parameter 222 transitions from the parameter level zero to the parameter levels PRc and PR-c at the time t0, remains at the parameter levels PRc and PR-c from the time t0 to the time t2, transitions from the parameter levels PRc and PR-c to the parameter level zero at the time t2, remains at the parameter level zero from the time t2 to the time t4, transitions from the parameter level zero to the parameter levels PRc and PR-c at the time t4, remains at the parameter levels PRc and PR-c from the time t4 to the time t6, transitions from the parameter levels PRc and PR-c to the parameter level zero at the time t6, and remains at the parameter level zero from the time t6 to the time t8. In a similar manner, the parameter 222 transitions between the parameter level zero and a set of the parameter levels PRc and PR-c during the cycle 2 of the synchronization signal 168.

In an embodiment, a second bias RF generator is coupled to another input of the match 112 (FIG. 1A) via an RF cable. The second bias RF generator receives a digital pulsed signal from the processor 118 via a cable system and receives the synchronization signal 168 via the cable system. The digital pulsed signal provides a duty cycle and a pulsing frequency of the parameter of an RF signal to be generated by the second bias RF generator. Upon receiving the synchronization signal 168, the second bias RF generator generates the RF signal in a similar manner in which the RF signal 172 is generated by the bias RF generator 106 based on the digital pulsed signal 169 and the synchronization signal 168. The pulsing frequency of the parameter of the RF signal is an integer multiple of the pulsing frequency of the parameter 206 of the RF signal 172. For example, the pulsing frequency of the parameter of the RF signal generated by the second bias RF generator is twice or thrice the pulsing frequency of the parameter 206 of the RF signal 172. Also, during each cycle of the synchronization signal 168, a pulse cycle of the parameter of the RF signal generated by the second bias RF generator starts at a time at which the parameter 206 starts its pulse cycle and ends at a time at which the parameter 206 ends its pulse cycle. For example, the pulse cycle of the parameter of the RF signal generated by the second bias RF generator starts at the time t0 and ends at the time t8. Another pulse cycle of the parameter of the RF signal generated by the second bias RF generator starts at the time t8 and ends at the time t16.

Figure 2G:
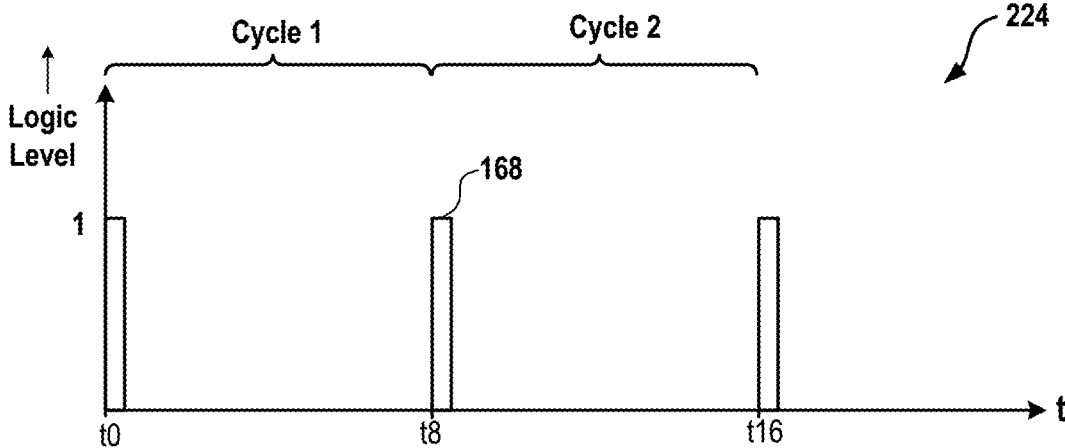
FIG. 2G is an embodiment of a graph to illustrate a synchronization signal.

FIG. 2G is an embodiment of a graph 224 to illustrate the synchronization signal 168. The graph 224 plots a logic level of the synchronization signal 168 on a y-axis and the time t on an x-axis. The synchronization signal 168 has a pulse at the time t0 and the pulse at the time t0 indicates a start of the cycle 1 of the synchronization signal 168. The synchronization signal 168 has another pulse at the time t8 and the pulse at the time t8 indicates a start of the cycle 2 of the synchronization signal 168. The start of the cycle 2 also indicates an end of the cycle 1 of the synchronization signal 168.

Figure 3:
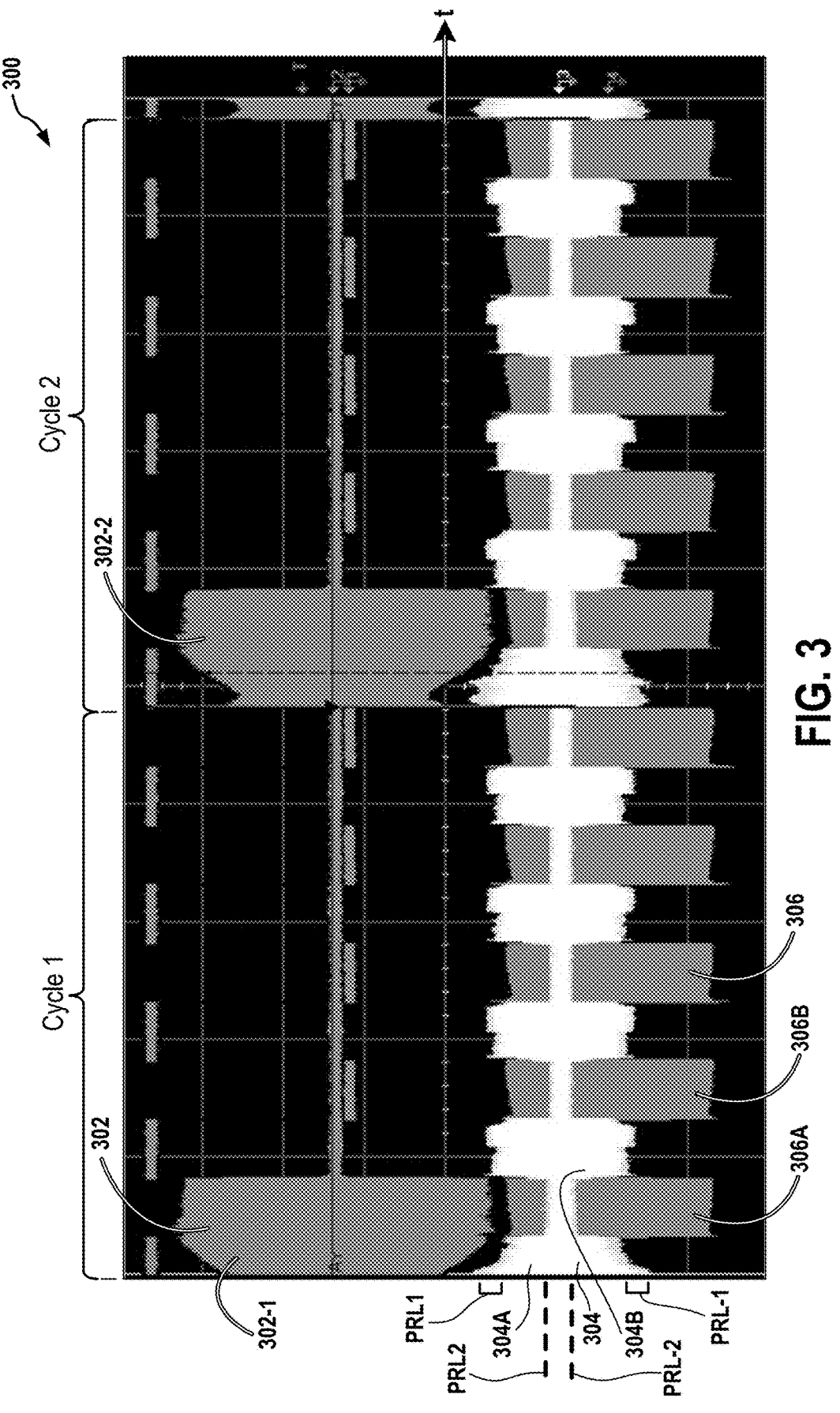
FIG. 3 is an embodiment of a graph to illustrate parameters of multiple RF signals.

FIG. 3 is an embodiment of a graph 300 to illustrate a parameter 302 of the RF signal 172 (FIG. 1A), a parameter 304 of the RF signal 178 (FIG. 1A), and a parameter 306 of the RF signal 184 (FIG. 1A). The parameters 302, 304, and 306 are plotted along a y-axis and the time t is plotted on an x-axis. A pulse 302_1 of the parameter 302 occurs during the cycle 1 of the synchronization signal 168 (FIG. 2A) and multiple pulses, such as pulses 304A and 304B, of the parameter 304 occur during the cycle 1. Similarly, multiple pulses, such as pulsed 306A and 306B, of the parameter 306 occur during the cycle 1 of the synchronization signal 168.

As an example, a pulse of a parameter includes a first set of two parameter levels that form a larger envelope than an envelope formed by a second set of parameter levels of the parameter. For example, the pulse 304A includes parameter levels PRL1 and PRL-1. The parameter level PRL1 is greater than or higher than a parameter level PRL2 of the parameter 304 and the parameter level PRL-2 is greater than or higher than a parameter level PRL-1 of the parameter 304. The parameter levels PRL1 and PRL-1 form an envelope that is larger than an envelope formed by the parameter levels PRL2 and PRL-2.

During the cycle 1 of the synchronization signal 168, pulses of the parameter 304 alternate with respect to the pulses of the parameter 306. For example, the pulse 304A of the parameter 304 is followed by the pulse 306A of the parameter 306, and the pulse 306A of the parameter 306 is followed by a pulse 304B of the parameter 304. A pulse 306B of the parameter 306 follows the pulse 304B of the parameter 304. To illustrate, the pulse 306A of the parameter 306 is consecutive to the pulse 304A of the parameter 304 and the pulse 304B of the parameter 304 is consecutive to the pulse 306A of the parameter 306. The pulse 304B of the parameter 306 is consecutive to the 304B of the parameter 304.

Similarly, during the cycle 2 of the synchronization signal 168, pulses of the parameters 302, 304, and 306 repeat in the same manner as that illustrated during the cycle 1 of the synchronization signal 168. For example, during the cycle 2 of the synchronization signal 168, another pulse 302_2 of the parameter 302 occurs and multiple pulses, such as five pulses, of the parameter 304 occur. Also, during the cycle 2 of the synchronization signal 168, multiple pulses, such as five pulses, of the parameter 306 occur. As illustrated in FIG. 3, a pulsing frequency of the parameter 302 is 100 hertz and the parameter 302 has a 20% duty cycle, a pulsing frequency of the parameter 304 is 500 hertz and the parameter 304 has a 50% duty cycle, and a pulsing frequency of the parameter 306 is 500 hertz and the parameter 306 has a 50% duty cycle.

The parameter levels PR1 and PR-1 represent a state S1 of the RF signal 172 and the parameter levels PRL2 and PRL-2 represent a state S0 of the RF signal 172.

Each pulse of the parameter 302 spans across a single pulse of the parameter 304 and a single pulse of the parameter 306. For example, the pulse 302_1 spans across the pulse 304A and the pulse 306A.

In an embodiment, a pulsing frequency of any of the parameters 302-306 is different from that illustrated in FIG. 3. For example, a pulsing frequency of the parameter 302 is 200 hertz, a pulsing frequency of the parameter 304 is 600 hertz, and a pulsing frequency of the parameter 306 is 800 hertz.

In an embodiment, a duty cycle of any of the parameters 302-306 is different from that illustrated in FIG. 3. For example, a duty cycle of the parameter 302 is 30%, a duty cycle of the parameter 304 is 60%, and a duty cycle of the parameter 306 is 70%.

In one embodiment, the parameter 302 is a parameter of the RF signal 178 and the parameter 304 is a parameter of the RF signal 172.

In an embodiment, the parameter 304 is a parameter of the RF signal 184 and the parameter 306 is a parameter of the RF signal 178.

Figure 4:
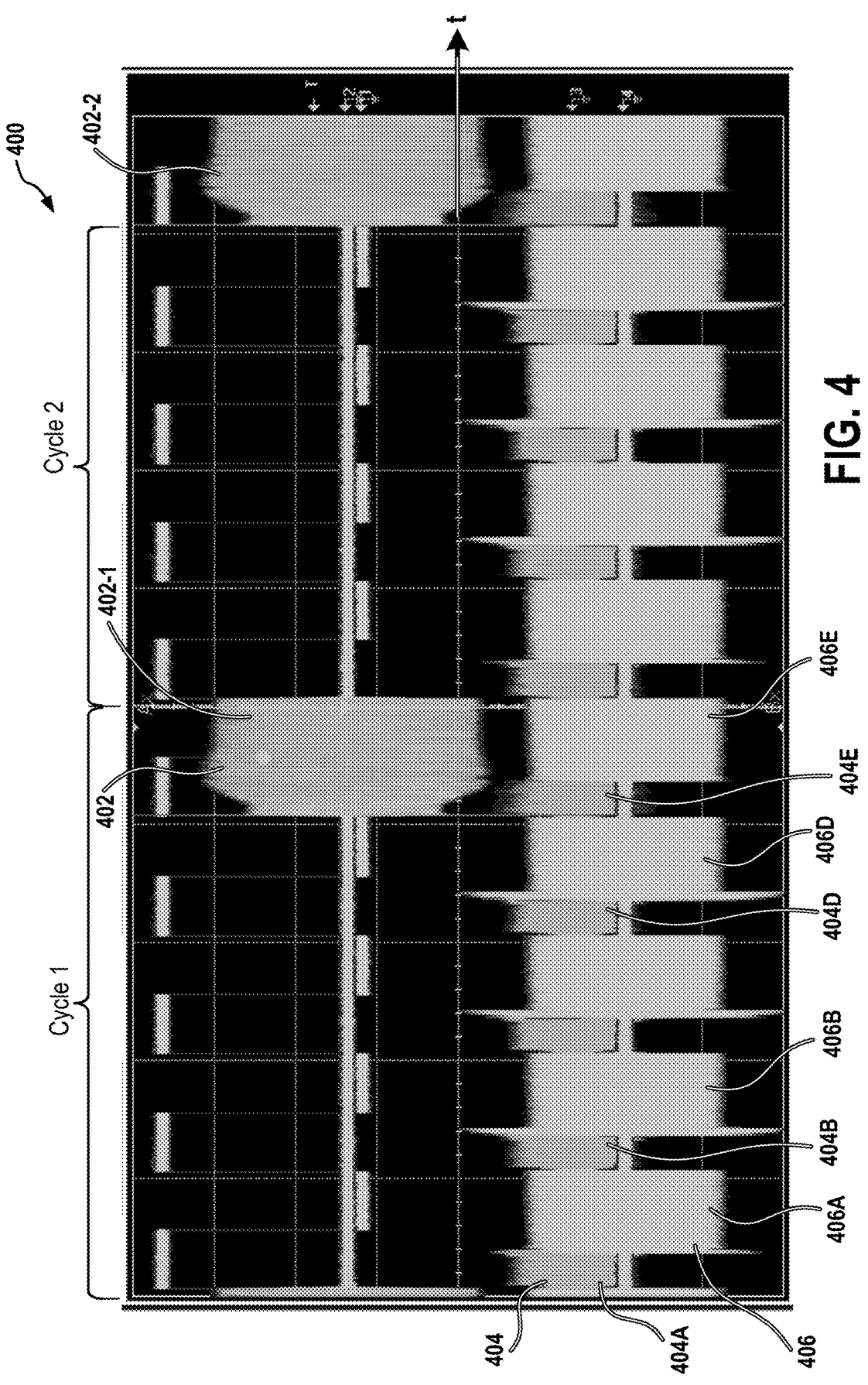
FIG. 4 is an embodiment of a graph to illustrate parameters of multiple RF signals.

FIG. 4 is an embodiment of a graph 400 to illustrate a parameter 402 of the RF signal 172 (FIG. 1A), a parameter 404 of the RF signal 178 (FIG. 1A), and a parameter 406 of the RF signal 184 (FIG. 1A). The parameters 402, 404, and 406 are plotted along a y-axis and the time t is plotted on an x-axis. A pulse 402_1 of the parameter 402 occurs during the cycle 1 of the synchronization signal 168 (FIG. 2A) and multiple pulses, such as pulses 404A and 404B, of the parameter 404 occur during the cycle 1. Similarly, multiple pulses, such as pulsed 406A and 406B, of the parameter 406 occur during the cycle 1 of the synchronization signal 168.

During the cycle 1 of the synchronization signal 168, pulses of the parameter 404 alternate with respect to the pulses of the parameter 406. For example, the pulse 404A of the parameter 404 is followed by the pulse 406A of the parameter 406, and the pulse 406A of the parameter 406 is followed by a pulse 404B of the parameter 404. A pulse 406B of the parameter 406 follows the pulse 404B of the parameter 404. To illustrate, the pulse 406A of the parameter 406 is consecutive to the pulse 404A of the parameter 404 and the pulse 404B of the parameter 404 is consecutive to the pulse 406A of the parameter 406. The pulse 406B of the parameter 406 is consecutive to the 404B of the parameter 404. As another example, a pulse 404D of the parameter 404 is followed by a pulse 406D of the parameter 406, and the pulse 406D of the parameter 406 is followed by a pulse 404E of the parameter 404. A pulse 406E of the parameter 406 follows the pulse 404E of the parameter 404.

Similarly, during the cycle 2 of the synchronization signal 168, pulses of the parameters 402, 404, and 406 repeat in the same manner as that illustrated during the cycle 1 of the synchronization signal 168. For example, during the cycle 2 of the synchronization signal 168, another pulse 402_2 of the parameter 402 occurs and multiple pulses, such as five pulses, of the parameter 404 occur. Also, during the cycle 2 of the synchronization signal 168, multiple pulses, such as five pulses, of the parameter 406 occur. As illustrated in FIG. 4, a pulsing frequency of the parameter 402 is 100 hertz and the parameter 402 has a 20% duty cycle, a pulsing frequency of the parameter 404 is 500 hertz and the parameter 404 has a 30% duty cycle, and a pulsing frequency of the parameter 406 is 500 hertz and the parameter 406 has a 70% duty cycle.

Each pulse of the parameter 402 spans across a single pulse of the parameter 404 and a single pulse of the parameter 406. For example, the pulse 402_1 spans across the pulse 404E and the pulse 406E.

In one embodiment, the parameter 402 is a parameter of the RF signal 178 and the parameter 404 is a parameter of the RF signal 172.

In an embodiment, the parameter 404 is a parameter of the RF signal 184 and the parameter 406 is a parameter of the RF signal 178.

In an embodiment, a pulsing frequency of any of the parameters 402-406 is different from that illustrated in FIG. 4.

In an embodiment, a duty cycle of any of the parameters 402-406 is different from that illustrated in FIG. 4.

Figure 5:
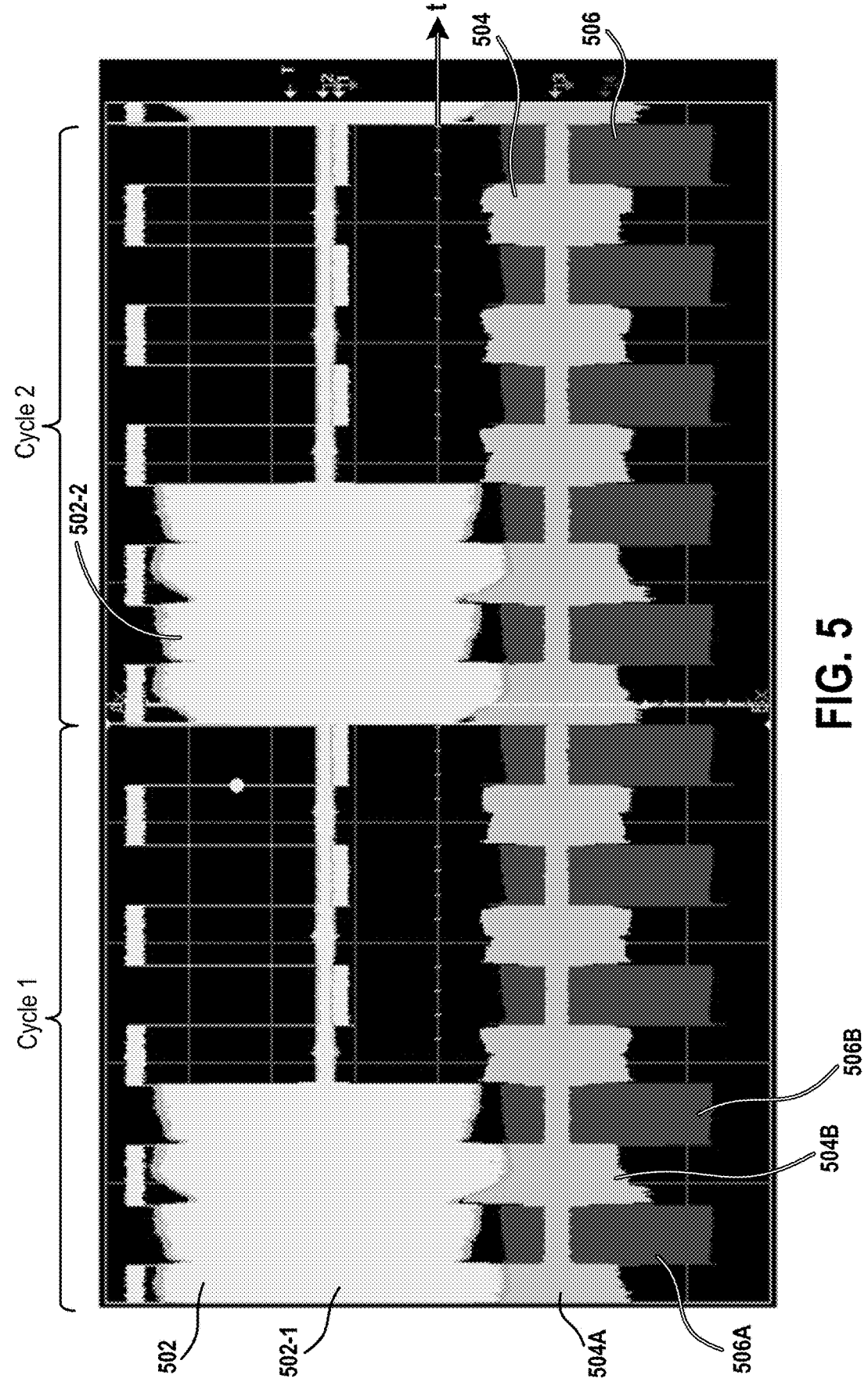
FIG. 5 is an embodiment of a graph to illustrate parameters of multiple RF signals.

FIG. 5 is an embodiment of a graph 500 to illustrate a parameter 502 of the RF signal 172 (FIG. 1A), a parameter 504 of the RF signal 178 (FIG. 1A), and a parameter 506 of the RF signal 184 (FIG. 1A). The parameters 502, 504, and 506 are plotted along a y-axis and the time t is plotted on an x-axis. A pulse 502_1 of the parameter 502 occurs during the cycle 1 of the synchronization signal 168 (FIG. 2A) and multiple pulses, such as pulses 504A and 504B, of the parameter 504 occur during the cycle 1. Similarly, multiple pulses, such as pulses 506A and 506B, of the parameter 506 occur during the cycle 1 of the synchronization signal 168.

During the cycle 1 of the synchronization signal 168, pulses of the parameter 504 alternate with respect to the pulses of the parameter 506. For example, the pulse 504A of the parameter 504 is followed by the pulse 506A of the parameter 506, and the pulse 506A of the parameter 506 is followed by a pulse 504B of the parameter 504. A pulse 506B of the parameter 506 follows the pulse 504B of the parameter 504. To illustrate, the pulse 506A of the parameter 506 is consecutive to the pulse 504A of the parameter 504 and the pulse 504B of the parameter 504 is consecutive to the pulse 506A of the parameter 506. The pulse 504B of the parameter 506 is consecutive to the 504B of the parameter 304.

Similarly, during the cycle 2 of the synchronization signal 168, pulses of the parameters 502, 504, and 506 repeat in the same manner as that illustrated during the cycle 1 of the synchronization signal 168. For example, during the cycle 2 of the synchronization signal 168, another pulse 502_2 of the parameter 502 occurs and multiple pulses, such as five pulses, of the parameter 504 occur. Also, during the cycle 2 of the synchronization signal 168, multiple pulses, such as five pulses, of the parameter 506 occur. As illustrated in FIG. 5, a pulsing frequency of the parameter 502 is 100 hertz and the parameter 502 has a 40% duty cycle, a pulsing frequency of the parameter 504 is 500 hertz and the parameter 504 has a 50% duty cycle, and a pulsing frequency of the parameter 506 is 500 hertz and the parameter 506 has a 50% duty cycle.

Each pulse of the parameter 502 spans across multiple pulses, such as two pulses, of the parameter 504 and multiple pulses of the parameter 506. For example, the pulse 502_1 spans across the pulses 504A and 504B and the pulses 506A and 506B.

In one embodiment, the parameter 502 is a parameter of the RF signal 178 and the parameter 504 is a parameter of the RF signal 172.

In an embodiment, the parameter 504 is a parameter of the RF signal 184 and the parameter 506 is a parameter of the RF signal 178.

In an embodiment, a pulsing frequency of any of the parameters 502-506 is different from that illustrated in FIG. 5.

In an embodiment, a duty cycle of any of the parameters 502-506 is different from that illustrated in FIG. 5.

Figure 6:
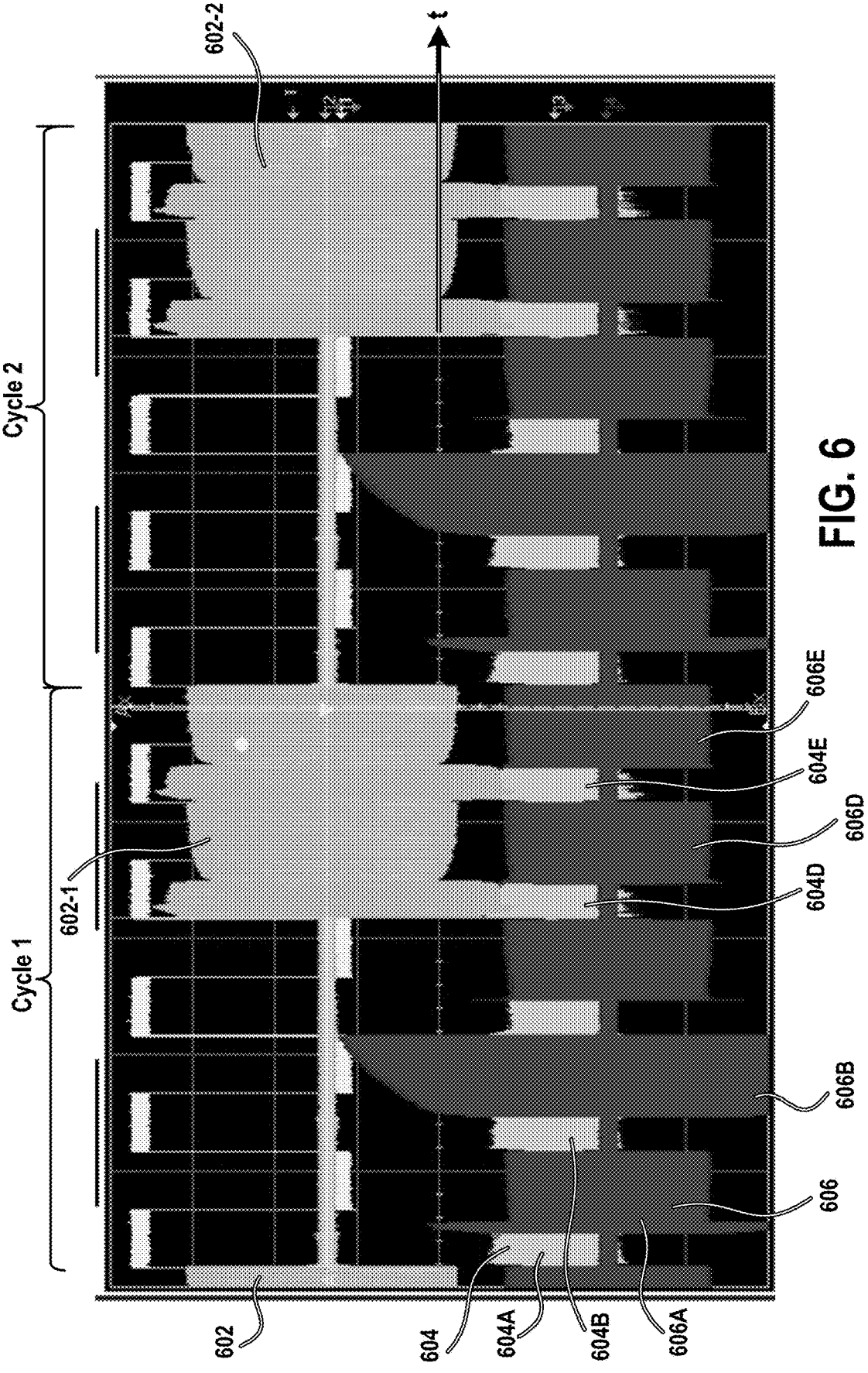
FIG. 6 is an embodiment of a graph to illustrate parameters of multiple RF signals.

FIG. 6 is an embodiment of a graph 600 to illustrate a parameter 602 of the RF signal 172 (FIG. 1A), a parameter 604 of the RF signal 178 (FIG. 1A), and a parameter 606 of the RF signal 184 (FIG. 1A). The parameters 602, 604, and 606 are plotted along a y-axis and the time t is plotted on an x-axis. A pulse 602_1 of the parameter 602 occurs during the cycle 1 of the synchronization signal 168 (FIG. 2A) and multiple pulses, such as pulses 604A and 604B, of the parameter 604 occur during the cycle 1. Similarly, multiple pulses, such as pulsed 606A and 606B, of the parameter 606 occur during the cycle 1 of the synchronization signal 168.

During the cycle 1 of the synchronization signal 168, pulses of the parameter 604 alternate or are asynchronized with respect to the pulses of the parameter 606. For example, the pulse 604A of the parameter 604 is followed by the pulse 606A of the parameter 606, and the pulse 606A of the parameter 606 is followed by a pulse 604B of the parameter 604. A pulse 606B of the parameter 606 follows the pulse 604B of the parameter 604. To illustrate, the pulse 606A of the parameter 606 is consecutive to the pulse 604A of the parameter 604 and the pulse 604B of the parameter 604 is consecutive to the pulse 606A of the parameter 606. The pulse 606B of the parameter 606 is consecutive to the 604B of the parameter 604. As another example, a pulse 604D of the parameter 604 is followed by a pulse 606D of the parameter 606, and the pulse 606D of the parameter 606 is followed by a pulse 604E of the parameter 604. A pulse 606E of the parameter 606 follows the pulse 604E of the parameter 604.

Similarly, during the cycle 2 of the synchronization signal 168, pulses of the parameters 602, 604, and 606 repeat in the same manner as that illustrated during the cycle 1 of the synchronization signal 168. For example, during the cycle 2 of the synchronization signal 168, another pulse 602_2 of the parameter 602 occurs and multiple pulses, such as five pulses, of the parameter 604 occur. Also, during the cycle 2 of the synchronization signal 168, multiple pulses, such as five pulses, of the parameter 606 occur. As illustrated in FIG. 6, a pulsing frequency of the parameter 602 is 100 hertz and the parameter 602 has a 40% duty cycle, a pulsing frequency of the parameter 604 is 500 hertz and the parameter 604 has a 30% duty cycle, and a pulsing frequency of the parameter 606 is 500 hertz and the parameter 606 has a 70% duty cycle.

Each pulse of the parameter 602 spans across multiple pulses of the parameter 604 and multiple pulses of the parameter 606. For example, the pulse 602_1 spans across the pulses 604E and 604E and the pulses 606D and 606E.

In one embodiment, the parameter 602 is a parameter of the RF signal 178 and the parameter 604 is a parameter of the RF signal 172.

In an embodiment, the parameter 604 is a parameter of the RF signal 184 and the parameter 606 is a parameter of the RF signal 178.

In an embodiment, a pulsing frequency of any of the parameters 602-606 is different from that illustrated in FIG. 6.

In an embodiment, a duty cycle of any of the parameters 602-606 is different from that illustrated in FIG. 6.

Figure 7:
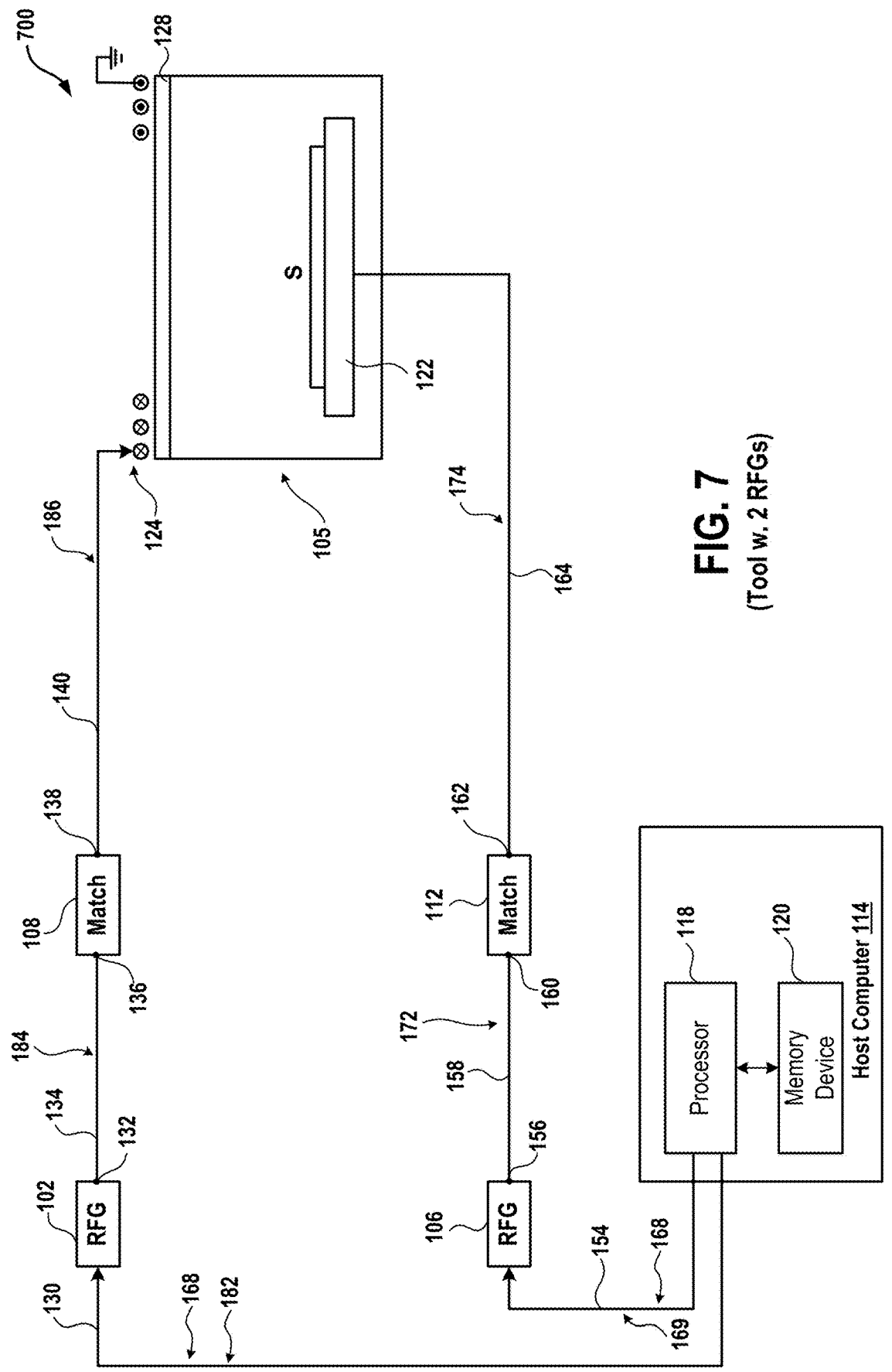
FIG. 7 is a diagram of an embodiment of a system to having a source RF generator and the bias RF generator.

FIG. 7 is a diagram of an embodiment of a system 700 including the source RF generator 102 coupled to the TCP coil 124 and the bias RF generator 106 coupled to the substrate support 122. The system 700 is the same as the system 101 of FIG. 1B except that the system 700 excludes the source RF generator 104 and the match 150 (FIG. 1A). The system 700 includes the match 108. The output 132 of the source RF generator 102 is coupled via the RF cable 134 to the input 136 of the match 108 and the output 138 of the match 108 is coupled via the RF transmission line 140 to the TCP coil 124 of the plasma chamber 105.

The RF signal 172 and the modified RF signal 174 are generated in the same manner as described above with respect to FIG. 1A. In addition, the RF signal 184 is generated in the same manner as described above with respect to FIG. 1A. Upon receiving the RF signal 184 via the RF cable 134 and the input 136, the match 108 matches an impedance of a load coupled to the output 138 of the match 108 with an impedance of the source coupled to the input 136 of the match 108. An example of the load coupled to the output 138 of the match 108 includes the RF transmission line 140 and the plasma chamber 105.

The match 108 matches an impedance of the load coupled to the output 138 of the match with an impedance of the source coupled to the input 136 of the match 108 to modify an impedance of the RF signal 184 to output the modified RF signal 186 at the output 138. The modified RF signal 186 is transferred from the output 138 of the match 108 via the RF transmission line 140 to the TCP coil 124. Upon receiving the modified RF signals 186 and 174, and the one or more process gases, plasma is stricken or maintained within the gap formed between the dielectric window 128 and the substrate support 122 of the plasma chamber 105.

FIGS. 8A-8D includes embodiments of graphs to illustrate an operation of the system 700 of FIG. 7. FIG. 8A is an embodiment of the graph 200 to illustrate the process recipe signal 169 of FIG. 7. FIG. 8B is an embodiment of the graph 204 to illustrate the parameter 206 of the RF signal 172 of FIG. 7. The parameter 206 of the RF signal 172 is generated by the bias RF generator 106 of FIG. 7 in synchronization with the synchronization signal 168.

FIG. 8C is an embodiment of the graph 208 to illustrate the digital pulsed signal 210, which is an example of the process recipe signal 182 of FIG. 7. FIG. 8D is an embodiment of the graph 212 to illustrate the parameter 214 of the RF signal 184 of FIG. 7. The parameter 214 of the RF signal 184 is generated by the source RF generator 102 of FIG. 7 in synchronization with the digital pulsed signal 210.

FIG. 9 is an embodiment of a display screen 900 of the host computer 114. The display screen 900 is of a display device that is coupled to the processor 118. The display screen 900 displays a field 901 for receiving an indication whether the TCP coils 124 and 126 (FIG. 1A) are to be operated in synchronization or asynchronization with each other. As an example, the TCP coil 124 operates asynchronous to an operation of the TCP coil 126 when the RF generators 102 and 104 operate asynchronously with each other. To illustrate, when the RF generator 102 is on and the RF generator 104 is off or when the RF generator 102 is off and the RF generator 104 is on, the RF generators 102 and 104 operate in asynchronization with each other.

The display screen 900 displays a field 902 for receiving a bias frequency value, in hertz, of operation of the bias RF generator 106 (FIG. 1A). Also the display screen 900 displays a field 904 for receiving a TCP frequency value of operation of the RF generators 102 and 104 (FIG. 1A). The display screen 900 displays a field 906 of receiving a duty cycle (DC) percentage of the bias RF generator 106. The DC percentage of the bias RF generator 106 is an amount of time for which the bias RF generator 106 is on as a percentage of a total time period of a cycle of the synchronization signal 168 (FIG. 2A). For example, the DC on percentage of the bias RF generator 106 is an amount of a time period between the times t0 and t4 (FIG. 2B) for which the parameter 206 of the bias RF generator 106 has the parameter levels PRa and PR-a as a percentage of a time period between the times t0 and t8 of the cycle 1 of the synchronization signal 168. As illustrated in FIG. 2B, the DC on percentage of the RF signal 172 is 50%. As another example, the DC on percentage of the RF signal 172 is in a range from 10% to 90%. To illustrate, the DC on percentage of the RF signal 172 is 20%.

The display screen 900 also displays a field 908 for receiving a DC percentage of the source RF generator 102 that is coupled to the TCP 126 (FIG. 1A). The DC on percentage of the source RF generator 102 is an amount of time for which the source RF generator 102 is on as a percentage of a total time period of a cycle of the synchronization signal 168 (FIG. 2A). For example, the DC on percentage of the source RF generator 102 is a sum of an amount of a time period between the times t0 and t2 (FIG. 2D) and an amount of a time period between the times t4 and t6 (FIG. 2D) for which the parameter 214 of the source RF generator 102 has the parameter levels PRb and PR-b as a percentage of a time period between the times t0 and t8 of the cycle 1 of the synchronization signal 168. As illustrated in FIG. 2D, the DC on percentage of the RF signal 184 (FIG. 1A) is 50%. As another example, the DC on percentage of the RF signal 184 is in a range from 10% to 90%. To illustrate, the DC on percentage of the RF signal 172 is 30%.

The indication of asynchronization or synchronization within the field 901, the bias frequency value of the field 902, the TCP frequency value of the field 904, the bias DC percentage of the field 906, and the source DC percentage of the field 908 are received by the processor 118 from a user via an input device (not shown) that is coupled to the processor 118. As an example, the processor 902 controls the fields 902-908 to enable receipt of the bias frequency value first, the TCP frequency value second, the bias DC percentage third, and the source DC percentage last. Examples of the input device include a mouse, a keyboard, a keypad, a touchpad, and a stylus.

In response to receiving the indication of synchronization or asynchronization within the field 901, the bias frequency value of the field 902, the TCP frequency value of the field 904, the bias DC percentage of the field 906, and the source DC percentage of the field 908, the processor 118 populates fields 910, 912, 914, 916, 918, 920, and 922 displayed on the display screen 900. For example, in response to receiving the indication of asynchronization within the field 901, the bias frequency value of the field 902, the TCP frequency value of the field 904, the bias DC percentage of the field 906, and the source DC percentage of the field 908, the processor 118 determines a time period of a cycle of operation of the bias RF generator 106 (FIG. 1A), and populates a field 910 of the display screen 900 with the time period. To illustrate, the processor 118 determines that the time period of the cycle of the RF signal 172 (FIG. 1A) is a ratio of 1 and the bias frequency value of the field 902. To further illustrate, when the bias frequency value is 200, the time period of the cycle of the RF signal 172 is 5000 microseconds (µs).

The processor 118 further determines that the bias RF generator 106 remains on for one cycle of asynchronous operation of the TCP coils 124 and 126 and remains off for remaining cycles of asynchronous operation of the TCP coils 124 and 126, and populates a field 912 of the display screen 900 with an on time of the bias RF generator 106 and a field 914 of the display screen 900 with an off time of the bias RF generator 106. For example, the processor 118 identifies from the field 906, the bias DC percentage of 20% and determines that 1000 microseconds is 20% of 5000 microseconds and populates the field 906 with 1000. The processor 118 further populates the field 914 with a difference of 4000 microseconds between 5000 microseconds and 1000 microseconds.

The processor 118 determines that during the cycle of asynchronous operation of the TCP coils 124 and 126, a duty cycle of operation of the TCP coil 124 is a difference between 100% and the source DC percentage of the field 908, and populates a field 916 of the display screen 900 with the duty cycle. For example, the duty cycle of operation of the TCP coil 124 is 70%, which is a difference between 100% and 30%. The duty cycle of operation of the TCP coil 124 is the same as a duty cycle of the RF generator 104 or of the RF signal 178 (FIG. 1A).

As an example, the duty cycle of an RF generator or an RF signal generated by the RF generator is an amount of time for which the RF signal has a positive parameter level during a time period of a cycle of the synchronization signal 168 (FIG. 2A). During the remaining time period of the cycle of the synchronization signal 168, the RF signal has a zero parameter level. As another example, the duty cycle of an RF generator or an RF signal generated by the RF generator is an amount of time for which the RF signal has a first positive parameter level during a time period of a cycle of the synchronization signal 168 (FIG. 2A). During the remaining time period of the cycle of the synchronization signal 168, the RF signal has a second positive parameter level. The first positive parameter level is greater than the second positive parameter level.

The processor 118 populates a field 918 of the display screen 900 with a time period of a cycle of operation of the TCP coils 124 and 126. As an example, with reference to FIGS. 2D and 2F, a time period of a cycle of operation of the TCP coils 124 and 126 is between the times t0 and t4 and a time period of another cycle of operation of the TCP coils 124 and 126 is between the times t4 and t8. To illustrate, the processor 118 populates the field 918 with 1000 microseconds (µs), which is a ratio of 1 and the TCP frequency value of the field 904. To further illustrate, 1000 µs is a total amount of time for which the parameter of the RF signal 184 has a first positive parameter level and the parameter of the RF signal 178 has a second positive parameter level during one cycle of asynchronous operation of the TCP coils 124 and 126. The first positive parameter level is greater than a zero parameter level, which is the parameter level of the RF signal 184 during a remaining time period of the cycle of asynchronous operation of the TCP coils 124 and 126. Also, the second positive parameter level is greater than a zero parameter level, which is the parameter level of the RF signal 178 during a remaining time period of the cycle of asynchronous operation of the TCP coils 124 and 126. In one embodiment, in the preceding illustration, instead of the zero parameter level, a positive parameter level is used.

As yet another example, the processor 118 populates a field 920 with a time for which the TCP coil 126 is on or operational during a cycle of the synchronization signal 168. To illustrate, the processor 118 populates the field 920 with 700 µs, which equal to a 70% duty cycle. As another example, the processor 118 populates a field 922 with a time for which the TCP coil 124 is on or operational during a cycle of the synchronization signal 168. To illustrate, the processor 118 populates the field 922 with 300 µs, which equal to a 30% duty cycle.

In one embodiment, an off time of an RF generator is an amount of time for which the RF generator does not generate an RF signal or generates an RF signal having a zero parameter level. In an embodiment, an off time of an RF generator is an amount of time for which the RF generator generates an RF signal having a parameter level that is lower than or less than a parameter level of an on time of the RF signal.

In one embodiment, the field 908 is for receiving a DC percentage of the source RF generator 104 that is coupled to the TCP coil 124 (FIG. 1A). The DC on percentage of the source RF generator 104 is an amount of time for which the source RF generator 104 is on as a percentage of a total time period of a cycle of the synchronization signal 168 (FIG. 2A). For example, the DC on percentage of the source RF generator 104 is a sum of an amount of a time period between the times t2 and t4 (FIG. 2F) and an amount of a time period between the times t6 and t8 (FIG. 2F) for which the parameter 222 of the RF signal 178 has the parameter levels PRc and PR-c as a percentage of a time period between the times t0 and t8 of the cycle 1 of the synchronization signal 168. As illustrated in FIG. 2F, the DC on percentage of the RF signal 178 (FIG. 1A) is 50%.

Figure 10A:
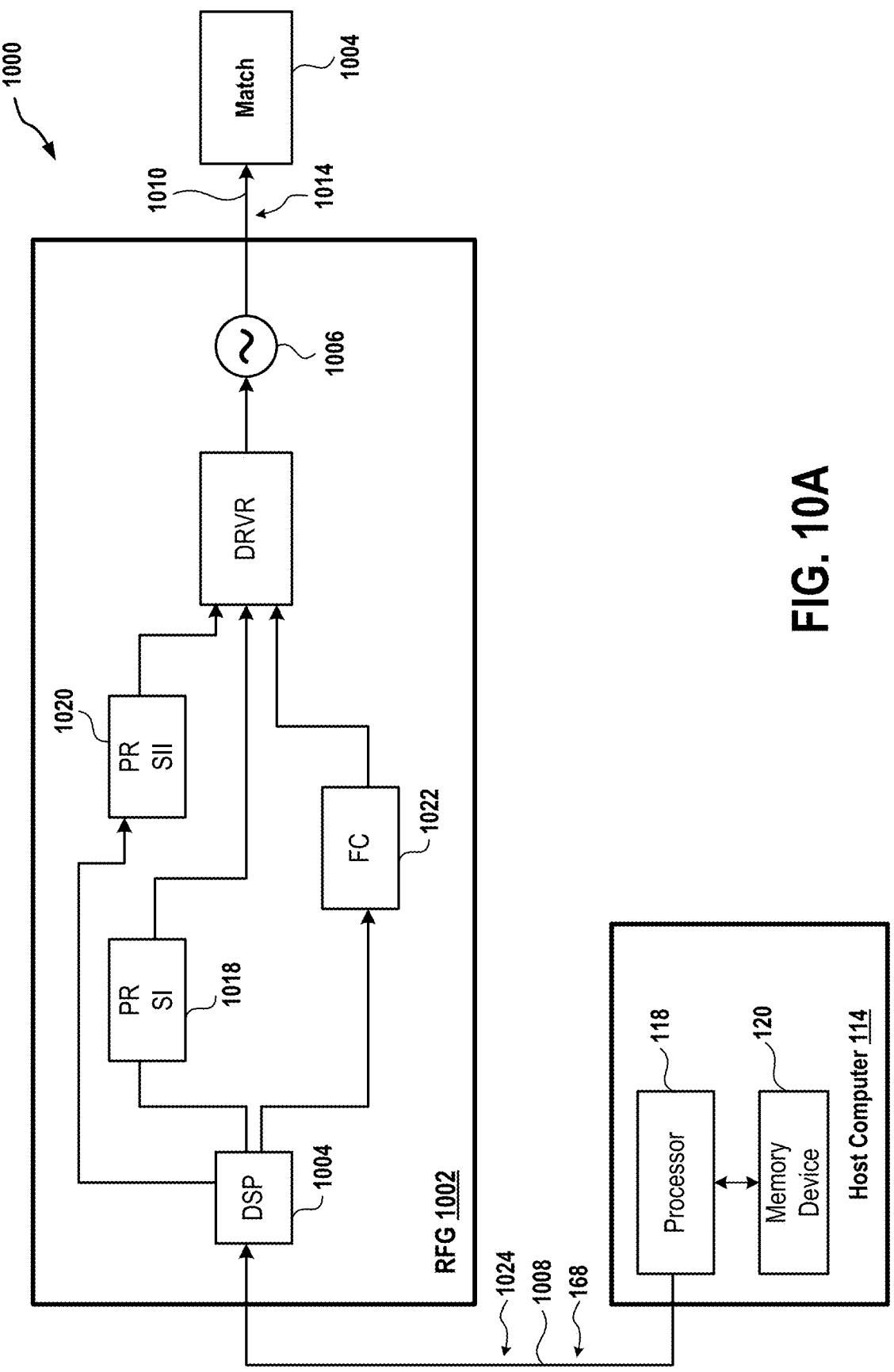
FIG. 10A is a diagram of an embodiment of a plasma system to illustrate a multi-state RF generator.

FIG. 10A is a diagram of an embodiment of a plasma system 1000 to illustrate a multi-state RF generator 1002. The multi-state RF generator 1002 is an example of any of the RF generators 102, 104, or 106 (FIG. 1A). The plasma system 1000 includes the RF generator 1002, a match 1004, and the host computer 114. The match 1004 is an example of any of the matches 108, 110, 112 (FIG. 1A), and 103 (FIG. 1B). For example, when the multi-state RF generator 1002 is the source RF generator 102, the match 1004 is an example of the match 108 or 103. As another example, when the multi-state RF generator 1002 is the source RF generator 104, the match 1004 is an example of the match 110 or 103. As yet another example, when the multi-state RF generator 1002 is the bias RF generator 106, the match 1004 is an example of the match 112.

The multi-state RF generator 1002 includes a digital signal processor (DSP) 1004, a parameter controller 1018 for the state S1, a parameter controller 1020 for the state S0, a frequency controller (FC) 1022, a driver system DRVR, and a power supply 1006. An example of a digital signal processor is a microprocessor chip. As used herein, as an example, a controller is an application specific integrated circuit (ASIC), or a programmable logic device (PLD), or a central processing unit (CPU), or a microprocessor, or a microcontroller, or a processor, or includes a processor and a memory device. The processor of the controller is coupled to the memory device of the controller. An example of a driver system, as used herein, includes one or more transistors that are coupled to each other. Another example of the driver system, as used herein, includes one or more transistors that are coupled to an amplifier and with each other. An example of a power supply, as used herein, include an RF oscillator that generates a sinusoidal signal at a radio frequency, such as ranging from and including 400 kHz to 100 MHz.

The processor 118 is coupled to the DSP 1004 via a cable system 1008. The cable system 1008 is an example of any of the cable system 130, 142, and 154 (FIG. 1A). For example, when the RF generator 1002 is an example of the RF generator 102, the cable system 1008 is an example of the cable system 130. As another example, when the RF generator 1002 is an example of the RF generator 104, the cable system 1008 is an example of the cable system 142. As yet another example, when the RF generator 1002 is an example of the RF generator 106, the cable system 1008 is an example of the cable system 154.

The DSP 1004 is coupled to the parameter controller 1018 and the parameter controller 1020. The DSP 1004 is also coupled to the frequency controller 1022. The parameter controllers 1018 and 1020 and the frequency controller 1022 are coupled to the driver system DRVR. The driver system DRVR is coupled to the power supply 1006.

The power supply 1006 is coupled via an RF cable 1010 to the match 1004. The RF cable 1010 is an example of any of the RF cables 134, 146, and 158 (FIG. 1A0. For example, when the RF generator 1002 is the source RF generator 102 and the match 1004 is the match 108, the RF cable 1010 is an example of the RF cable 134. As another example, when the RF generator 1002 is the source RF generator 104 and the match 1004 is the match 110, the RF cable 1010 is an example of the RF cable 146. As yet another example, when the RF generator 1002 is the bias RF generator 106 and the match 1004 is the match 112, the RF cable 1010 is an example of the RF cable 158. As another example, when the RF generator 1002 is the source RF generator 102 and the match 1004 is the match 103, the RF cable 1010 is an example of the RF cable 134 (FIG. 1B).

The processor 118 accesses parameter levels PRS1 and PRSII from the memory device 120 and sends the parameter levels PRS1 and PRSII via the cable system 1008 to the DSP 1004. The memory device 120 stores the parameter levels PRSI and PRSII. The parameter levels PRSI and PRSII are of an RF signal 1014 to be generated by the RF generator 1002. The RF signal 1014 is an example of any of the RF signals 172, 178, and 184 (FIG. 1A). For example, the RF signal 1014 is an example of the RF signal 172 when the RF generator 1002 is the bias RF generator 106. As another example, the RF signal 1014 is an example of the RF signal 178 when the RF generator 1002 is the source RF generator 104. As yet another example, the RF signal 1014 is an example of the RF signal 184 when the RF generator 1002 is the source RF generator 102.

The parameter levels PRSI received by the DSP 1004 are for a first state, such as the state S1 or the state S0, of a process recipe signal 1024 and the parameter levels PRSII received are for a second state, such as the state S0 or the state S1, of the process recipe signal 1024. Examples of the parameter levels PRSI received include the parameter levels PRa and PR-a for the state S1 of the process recipe signal 1024, the parameter levels PRb and PR-b for the state S1 of the process recipe signal 1024, the parameter levels PRc and PR-c for the state S1 of the process recipe signal 1024, and the parameter level zero for the state S0 of the process recipe signal 1024. An example of the parameter levels PRSII include the parameter level zero for the state S0 of the process recipe signal 1024, the parameter levels PRa and PR-a for the state S1 of the process recipe signal 1024, the parameter levels PRb and PR-b for the state S1 of the process recipe signal 1024, and the parameter levels PRc and PR-c for the state S1 of the process recipe signal 1024. For example, when the parameter levels PRSI are for the state S1 of the process recipe signal 1024, the parameter levels PRSII are for the state S0 of the process recipe signal 1024, and when the parameter levels PRSI are for the state S0 of the process recipe signal 1024, the parameter levels PRSII are for the state S1 of the process recipe signal 1024.

The DSP 1004 receives the parameter levels for the first and second states of the process recipe signal 1024 and provides the parameter levels to the parameter controllers 1018 and 1020. For example, the parameter levels PRSI are sent from the DSP 1004 to the parameter controller 1018 and the parameter levels PRSII are sent from the DSP 1004 to the parameter controller 1020. The parameter level PRSI is stored in the memory device of the parameter controller 1018 and the parameter level PRSII is stored in the memory device of the parameter controller 1020.

Also, the processor 118 sends a frequency of operation of the RF generator 1002 via the cable system 1008 to the DSP 1004. The frequency of operation of the RF generator 1002 is the same as a frequency of the RF signal 1014. The frequency of the RF signal 1014 is greater than a pulsing frequency of an envelope of the RF signal 1014. For example, the frequency of the RF signal 1014 is greater than a pulsing frequency of the parameter of the RF signal 1014.

The DSP 1004 receives the frequency of operation of the RF generator 1002 and sends the frequency to the frequency controller 1022. The frequency controller 1022 stores the frequency of operation of the RF generator 1002 within the memory device of the frequency controller 1022.

The processor 118 generates and sends the process recipe signal 1024 via the cable system 1008 to the DSP 1004. An example of the process recipe signal 1024 is any of the process recipe signals 169, 176, and 182 (FIG. 2A). To illustrate, when the RF generator 1002 is an example of the source RF generator 102, the process recipe signal 1024 is an example of the process recipe signal 182 (FIG. 1A). As another example, when the RF generator 1002 is an example of the source RF generator 104, the process recipe signal 1024 is an example of the process recipe signal 176 (FIG. 1A) and when the RF generator 1002 is an example of the bias RF generator 106, the process recipe signal 1024 is an example of the process recipe signal 169 (FIG. 1A).

The process recipe signal 1024 provides a duty cycle of the parameter of the RF signal 1014 to be generated by the RF generator 1002 and a pulsing frequency of the parameter of the RF signal 1014. The DSP 1004 receives the process recipe signal 1024 and is programmed to execute the process recipe signal 1024 when the synchronization signal 168 is received from the processor 118.

The processor 118 sends the synchronization signal 168 via the cable system 1008 to the DSP 1004. Upon receiving the synchronization signal 168, during a first cycle, such as the cycle 1, of the synchronization signal 168, the DSP 1004 sends at a time of transition from the second state, such as the state S0 or the state S1, of the process recipe signal 1024 to the first state, such as the state S1 or the state S0, of the process recipe signal 1024, an instruction to the power controller 1018. The instruction is sent to the power controller 1018 according to the process recipe signal 1024. Upon receiving the instruction from the DSP 1004, the power controller 1018 accesses the parameter levels PRSI for the first state of the process recipe signal 1024 from the memory device of the power controller 1018, generates a command signal indicating the parameter levels PRSI, and sends the command signal to the driver system DRVR.

Also, upon receiving the synchronization signal 168, the DSP 1004 sends an instruction to the frequency controller FC. Upon receiving the instruction from the DSP 1004, the frequency controller FC accesses the frequency of operation of the RF generator 1002 from the memory device of the frequency controller, generates a command signal indicating the frequency of operation, and sends the command signal to the driver system DRVR.

Upon receiving the command signal indicating the parameter levels PRSI and the frequency of operation, the driver system DRVR generates a current signal for the first state based on the parameter levels PRSI and the frequency, and sends the current signal to the power supply 1006. In response to receipt of the current signal for the first state, the power supply 1006 generates the RF signal 1014 having the parameter levels PRSI and the frequency. The RF signal 1014 having the parameter levels PRSI is generated at the time of transition from the second state of the process recipe signal 1024 during the first cycle of the synchronization signal 168 to the first state of the process recipe signal 1024 during the first cycle of the synchronization signal 168. In this manner, the RF signal 1014 having the parameter levels PRSI is generated until a time of transition from the first state of the process recipe signal 1024 during the first cycle of the synchronization signal 168 to the second state of the process recipe signal 1024 during the first cycle of the synchronization signal 168 occurs. The parameter levels PRS1 are generated until the time of transition to define a duty cycle of the process recipe signal 1024.

Upon receiving the synchronization signal 168, the DSP 1004 sends at the time of transition from the first state of the process recipe signal 1024 during the first cycle of the synchronization signal 168 to the second state of the process recipe signal 1024 during the first cycle of the synchronization signal 168, an instruction to the power controller 1020. Upon receiving the instruction from the DSP 1004, the power controller 1020 accesses the parameter levels PRSII for the second state of the process recipe signal 1024 from the memory device of the power controller 1020, generates a command signal indicating the parameter levels PRSII, and sends the command signal to the driver system DRVR.

Upon receiving the command signal indicating the parameter levels PRSII and the frequency of operation, the driver system DRVR generates a current signal for the second state of the process recipe signal 1024 during the first cycle of the synchronization signal 168 based on the parameter levels PRSII and the frequency, and sends the current signal to the power supply 1006. In response to receipt of the current signal for the second state of the process recipe signal 1024 during the first cycle of the synchronization signal 168, the power supply 1006 generates the RF signal 1014 having the parameter levels PRSII and the frequency. The RF signal 1014 having the parameter levels PRSII and the frequency is generated at the time of transition from the first state of the process recipe signal 1024 during the first cycle of the synchronization signal 168 to the second state of the process recipe signal 1024 during the first cycle of the synchronization signal 168. In this manner, the RF signal 1014 having the parameter levels PRSII is generated until a time of transition from the second state of the process recipe signal 1024 during the second cycle of the synchronization signal 168 to the first state of the process recipe signal 1024 during the second cycle of the synchronization signal 168 occurs to achieve the duty cycle of the process recipe signal 1024. In this manner, the RF signal 1014 that switches or transitions between the parameter levels PRSI and PRSII is generated for each cycle of the synchronization signal 168 in accordance with the process recipe signal 1024.

Figure 10B:
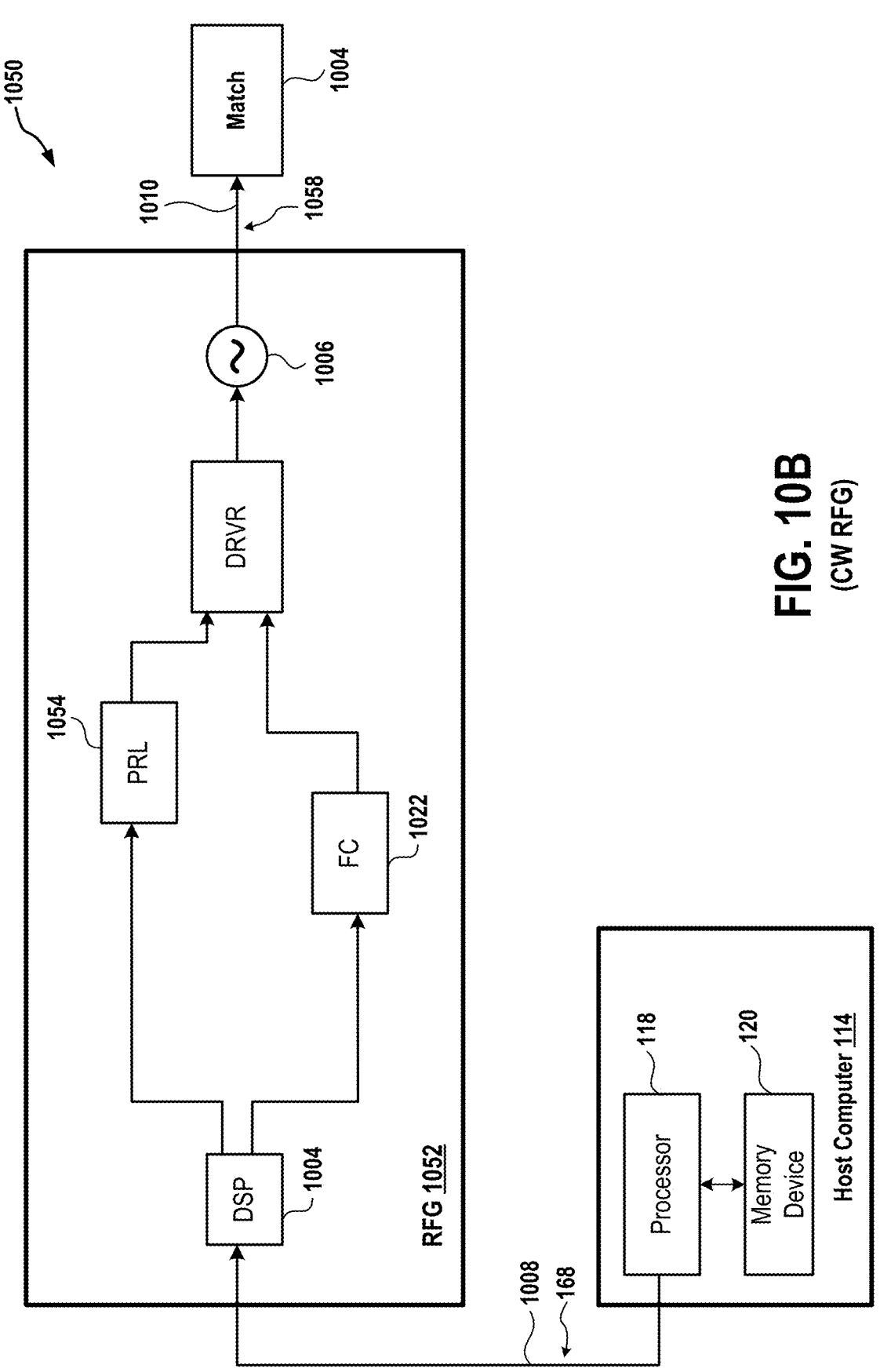
FIG. 10B is a diagram of an embodiment of a plasma system to illustrate a continuous wave (CW) RF generator.

FIG. 10B is a diagram of an embodiment of a plasma system 1050 to illustrate a continuous wave (CW) RF generator 1052. The CW RF generator 1052 is an example of any of the RF generators 102, 104, or 106 (FIG. 1A). The plasma system 1050 includes the CW RF generator 1052, the match 1004, and the host computer 114. The match 1004 is an example of any of the matches 108, 110, 112 (FIG. 1A), and 103 (FIG. 1B). For example, when the CW RF generator 1052 is the source RF generator 102, the match 1004 is an example of the match 108 or 103. As another example, when the CW RF generator 1052 is the source RF generator 104, the match 1004 is an example of the match 110 or 103. As yet another example, when the CW RF generator 1052 is the bias RF generator 106, the match 1004 is an example of the match 112.

The CW RF generator 1052 includes the DSP 1004, a parameter controller 1054, the frequency controller 1022, the driver system DRVR, and the power supply 1006. The cable system 1008 is an example of any of the cable systems 130, 142, and 154 (FIG. 1A). For example, when the RF generator 1052 is an example of the RF generator 102, the cable system 1008 is an example of the cable system 130. As another example, when the RF generator 1052 is an example of the RF generator 104, the cable system 1008 is an example of the cable system 142. As yet another example, when the RF generator 1052 is an example of the RF generator 106, the cable system 1008 is an example of the cable system 154. The DSP 1004 is coupled to the parameter controller 1054. The controller 1054 is coupled to the driver system DRVR.

The DSP 1004 receives a parameter level PRL via the cable system 1008 from the processor 118. The parameter level PRL is of an RF signal 1058 to be generated by the CW RF generator 1052. The RF signal 1058 is an example of any of the RF signals 172, 178, and 184 (FIG. 1A). For example, the RF signal 1058 is an example of the RF signal 172 when the RF generator 1052 is the bias RF generator 106. As another example, the RF signal 1058 is an example of the RF signal 178 when the RF generator 1052 is the source RF generator 104. As yet another example, the RF signal 1058 is an example of the RF signal 184 when the RF generator 1052 is the source RF generator 102.

The parameter level PRL received is for both the first state and the second state of the process recipe signal 1024 (FIG. 10A). For example, during a time period between the times t0 and t8 in which the RF signal 1014 (FIG. 10A) generated by the RF generator 1002 (FIG. 10A) has the parameter levels PRSI and PRS11, the RF signal 1058 generated by the RF generator 1052 has the parameter level PRL.

The DSP 1004 receives the parameter level PRL for the first and second states of the process recipe signal 1024 and provides the parameter level PRL to the parameter controller 1054. The parameter level PRL is stored in the memory device of the parameter controller 1054. Also, the processor 118 sends a frequency of operation of the RF generator 1052 via the cable system 1008 to the DSP 1004, which sends the frequency to the frequency controller 1022 for storage within the memory device of the frequency controller 1022.

The processor 118 sends the synchronization signal 168 via the cable system 1008 to the DSP 1004. Upon receiving the synchronization signal 168, during a first cycle, such as the cycle 1, of the synchronization signal 168, the DSP 1004 sends an instruction to the power controller 1054. Upon receiving the instruction from the DSP 1004, the power controller 1054 accesses the parameter level PRL for the first and second states process recipe signal 1024 from the memory device of the power controller 1054, generates a command signal indicating the parameter level PRL, and sends the command signal to the driver system DRVR.

Also, upon receiving the synchronization signal 168, the DSP 1004 sends an instruction to the frequency controller FC. Upon receiving the instruction from the DSP 1004, the frequency controller FC accesses the frequency of operation of the RF generator 1002 from the memory device of the frequency controller, generates a command signal indicating the frequency of operation, and sends the command signal to the driver system DRVR.

Upon receiving the command signals indicating the parameter level PRL and the frequency of operation, the driver system DRVR generates a current signal for the first and second states of the process recipe signal 1024 based on the parameter level PRL and the frequency, and sends the current signal to the power supply 1006. In response to receipt of the current signal for the first and second states of the process recipe signal 1024, the power supply 1006 generates the RF signal 1058 having the parameter level PRL and the frequency. The RF signal 1058 having the parameter level PRL and the frequency is generated during the first cycle of the synchronization signal 168. In this manner, the RF signal 1058 that remains at the parameter level PRL is generated for each cycle of the synchronization signal 168.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more micro-processors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipe to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods, described herein, are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, a capacitively coupled plasma (CCP) plasma chamber, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for pulsing, comprising:
generating a first radio frequency (RF) signal;
pulsing a parameter of the first RF signal between a first parameter level and a second parameter level at a pulsing frequency during a cycle of a digital pulsed signal;
generating a second RF signal; and
pulsing a parameter of the second RF signal at a higher pulsing frequency than the pulsing frequency of the parameter of the first RF signal during the cycle,
wherein during the cycle, a start time of said pulsing the parameter of the first RF signal is synchronized with a start time of said pulsing the parameter of the second RF signal and an end time of said pulsing the parameter of the first RF signal is synchronized with an end time of said pulsing the parameter of the second RF signal.

2. The method of claim 1, wherein the first parameter level of the first RF signal is greater than the second parameter level of the first RF signal, wherein the parameter of the second RF signal is pulsed between a third parameter level and a fourth parameter level, wherein the third parameter level of the second RF signal is greater than the fourth parameter level of the second RF signal.

3. The method of claim 1, wherein the second parameter level of the first RF signal is within a range of five percent from zero.

4. The method of claim 1, wherein the pulsing frequency of the parameter of the second RF signal is an integer multiple of the pulsing frequency of the parameter of the first RF signal to achieve the synchronization between the start times and the end times.

5. The method of claim 1, wherein the parameter of the second RF signal is pulsed between a third parameter level and a fourth parameter level, wherein the start times are synchronized during the cycle when the parameter of the first RF signal transitions from the second parameter level to the first parameter level simultaneously with a transition of the parameter of the second RF signal from the fourth parameter level to the third parameter level, and the end times are synchronized during the cycle when the parameter of the first RF signal transitions from the second parameter level to the first parameter level simultaneously with a transition of the parameter of the second RF signal from the fourth parameter level to the third parameter level.

6. The method of claim 1, further comprising:
supplying the first RF signal to a first impedance matching circuit that is coupled to a substrate support;
supplying the second RF signal to a second impedance matching circuit that is coupled to an RF coil.

7. The method of claim 1, further comprising:
generating a third RF signal;
pulsing a parameter of the third RF signal between a third parameter level and a fourth parameter level during the cycle,
wherein during the cycle, a start time of said pulsing the parameter of the third RF signal is synchronized with the start time of said pulsing the parameter of the first RF signal and an end time of said pulsing the parameter of the third RF signal is synchronized with the end time of said pulsing the parameter of the first RF signal.

8. The method of claim 7,
wherein the start time of the parameter of the third RF signal is synchronized with the start time of parameter of the first RF signal when the parameter of the third RF signal transitions from the third parameter level to the fourth parameter level simultaneously with a transition of the parameter of the first RF signal from the second parameter level to the first parameter level, wherein the end time of the parameter of the third RF signal is synchronized with the end time of parameter of the first RF signal when the parameter of the third RF signal transitions from the third parameter level to the fourth parameter level simultaneously with a transition of the parameter of the first RF signal from the second parameter level to the first parameter level.

9. The method of claim 7, comprising:

supplying the first RF signal to a first match coupled to a substrate support of a plasma chamber; and supplying the second RF signal to a second match coupled to a first transformer coupled plasma (TCP) coil of the plasma chamber; and supplying the third RF signal to a third match coupled to a second TCP coil of the plasma chamber.

10. The method of claim 7, wherein the parameter of the third RF signal is pulsed between the third and fourth parameter levels to be in reverse synchronization with said pulsing the parameter of the second RF signal.

11. The method of claim 10, comprising:

supplying the first RF signal to a first match coupled to a substrate support of a plasma chamber; and supplying the second RF signal to a second match coupled to a first transformer coupled plasma (TCP) coil of the plasma chamber; and supplying the third RF signal to a third match coupled to a second TCP coil of the plasma chamber.

12. The method of claim 10, wherein the parameter of the second RF signal is pulsed between a fifth parameter level and a sixth parameter level, wherein the reverse synchronization is achieved when the parameter of the second RF signal transitions from the fifth parameter level to the sixth parameter level at a time the parameter of the third RF signal transitions from the fourth parameter level to the third parameter level.

13. The method of claim 12, wherein the reverse synchronization is achieved when the parameter of the second RF signal transitions from the sixth parameter level to the fifth parameter level at a time the parameter of the third RF signal transitions from the third parameter level to the fourth parameter level.

14. The method of claim 13, wherein the third parameter level is lower than the fourth parameter level and the fifth parameter level is lower than the sixth parameter level.

15. The method of claim 1, comprising:

supplying the first RF signal to a first match coupled to a substrate support of a plasma chamber; and supplying the second RF signal to a second match coupled to a transformer coupled plasma (TCP) coil of the plasma chamber.

* * * * *